(12) United States Patent
Jeong et al.

(10) Patent No.: US 11,917,881 B2
(45) Date of Patent: Feb. 27, 2024

(54) DISPLAY DEVICE INCLUDING LIGHT EMITTING AREAS AROUND LIGHT TRANSMITTING AREAS

(71) Applicant: Samsung Display Co., LTD., Yongin-si (KR)

(72) Inventors: Woong Hee Jeong, Seoul (KR); Ki Bum Kim, Hwaseong-si (KR); Jin Yeong Kim, Icheon-si (KR); Hyang A Park, Seoul (KR); Tae Hoon Yang, Yongin-si (KR); Jong Chan Lee, Suwon-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 0 days.

(21) Appl. No.: 17/944,717

(22) Filed: Sep. 14, 2022

(65) Prior Publication Data

US 2023/0019300 A1 Jan. 19, 2023

Related U.S. Application Data

(62) Division of application No. 16/927,369, filed on Jul. 13, 2020, now Pat. No. 11,469,274.

(30) Foreign Application Priority Data

Jul. 26, 2019 (KR) .................. 10-2019-0091131

(51) Int. Cl.
*H10K 50/84* (2023.01)
*H10K 59/12* (2023.01)
(Continued)

(52) U.S. Cl.
CPC .......... *H10K 59/30* (2023.02); *H10K 50/844* (2023.02); *H10K 59/122* (2023.02);
(Continued)

(58) Field of Classification Search
CPC .. H10K 50/844; H10K 50/865; H10K 50/828; H10K 50/8445; H10K 50/85;
(Continued)

(56) References Cited

U.S. PATENT DOCUMENTS

| | | | |
|---|---|---|---|
| 10,236,326 B2 | 3/2019 | Lee et al. | |
| 2014/0014983 A1 | 1/2014 | Edwards | |
| 2015/0102320 A1 | 4/2015 | Jung | |
| 2015/0108455 A1* | 4/2015 | Jung | H10K 59/352 257/40 |

(Continued)

FOREIGN PATENT DOCUMENTS

| | | | | |
|---|---|---|---|---|
| CN | 109584794 A | * | 4/2019 | ........... G09G 3/3208 |
| KR | 10-2016-0068592 | | 6/2016 | |

(Continued)

*Primary Examiner* — Ida M Soward
(74) *Attorney, Agent, or Firm* — KILE PARK REED & HOUTTEMAN PLLC

(57) ABSTRACT

A display device includes light transmitting areas including a first light transmitting area and light emitting areas around the light transmitting areas and including a first light emitting area disposed around the first light transmitting area, wherein the first light emitting area includes a first-first light emitting area adjacent to a first portion of each of the light transmitting areas, a first-second light emitting area adjacent to a second portion of each of the light transmitting areas, a first-third light emitting area adjacent to a third portion of each of the light transmitting areas, and a first-fourth light emitting area disposed adjacent to a fourth portion of each of the light transmitting areas. The first-first to first-fourth light emitting areas each include at least one of first to third light emitting portions to emit light of first to third colors, respectively.

6 Claims, 16 Drawing Sheets

(51) Int. Cl.
    *H10K 59/30*     (2023.01)
    *G02F 1/13*     (2006.01)
    *H10K 50/844*     (2023.01)
    *H10K 59/122*     (2023.01)
    *G02F 1/1335*     (2006.01)
    *G02F 1/1362*     (2006.01)
    *H10K 59/127*     (2023.01)
    *H10K 102/00*     (2023.01)

(52) U.S. Cl.
    CPC .. *G02F 1/133512* (2013.01); *G02F 1/136209* (2013.01); *H10K 59/1275* (2023.02); *H10K 2102/00* (2023.02)

(58) Field of Classification Search
    CPC .. H10K 59/30; H10K 59/122; H10K 59/1275; H10K 59/121; H10K 59/35; H10K 59/353; H10K 59/1213; H10K 59/123; H10K 59/124; H10K 59/12; G02F 1/133512; G02F 1/136209
    See application file for complete search history.

(56) References Cited

U.S. PATENT DOCUMENTS

| | | | |
|---|---|---|---|
| 2016/0380037 A1* | 12/2016 | Kajiyama | H10K 59/1213 257/88 |
| 2017/0352710 A1* | 12/2017 | Hong | H10K 59/352 |
| 2018/0069065 A1* | 3/2018 | Chen | H10K 50/80 |
| 2018/0308412 A1 | 10/2018 | Wu et al. | |
| 2019/0131358 A1 | 5/2019 | Yang et al. | |
| 2019/0372057 A1* | 12/2019 | Park | H10K 59/12 |
| 2019/0386242 A1 | 12/2019 | Choi et al. | |
| 2020/0006443 A1 | 1/2020 | Park et al. | |
| 2020/0203445 A1 | 6/2020 | Ou et al. | |
| 2020/0251534 A1 | 8/2020 | Lan et al. | |
| 2020/0319731 A1 | 10/2020 | Yeke Yazdandoost et al. | |
| 2020/0357863 A1 | 11/2020 | Nakamura et al. | |
| 2021/0359031 A1 | 11/2021 | Zheng et al. | |
| 2021/0384269 A1 | 12/2021 | Zhou et al. | |

FOREIGN PATENT DOCUMENTS

| | | |
|---|---|---|
| KR | 10-2016-0083991 | 7/2016 |
| KR | 10-1763442 | 7/2017 |
| KR | 10-2018-0014905 | 2/2018 |

* cited by examiner

LA1: LA1-1, LA1-2, LA1-3, LA1-4, LA1-5

110: 111, 112, 113
120: 121 ~ 123
130: 131 ~ 136
140: 141 ~ 143

DISPLAY DEVICE INCLUDING LIGHT EMITTING AREAS AROUND LIGHT TRANSMITTING AREAS

CROSS-REFERENCE TO RELATED APPLICATION(S)

This is a divisional application of U.S. patent application Ser. No. 16/927,369 filed Jul. 13, 2020 (now pending), the disclosure of which is incorporated herein by reference in its entirety. U.S. patent application Ser. No. 16/927,369 claims priority to and benefits of Korean Patent Application No. 10-2019-0091131 under 35 U.S.C. § 119, filed in the Korean Intellectual Property Office (KIPO) on Jul. 26, 2019, the entire contents of which are incorporated herein by reference.

BACKGROUND

1. Technical Field

The disclosure relates to a display device, and, to a transparent display device.

2. Description of the Related Art

Display technology including display devices for processing and displaying large amounts of information continues to be rapidly developed. Examples of display devices which are the focus of research and development include a liquid crystal display (LCD) device, a plasma display panel (PDP), a field emission display (FED) device, an electroluminescence display (ELD) device, and an organic light emitting diode (OLED) display device.

In recent years, a vast majority of research has been carried out on transparent display devices. Transparent display devices allow a user to view an object or background disposed at the back of the display device. The transparent display devices have advantages in terms of space utilization, interior and design and are applicable to various uses and fields. The transparent display devices implement information recognition, information processing, and information display functions using transparent electronic devices, thereby addressing spatial and visual limitations of existing electronic devices. For example, transparent display devices may be applied to windows of buildings or vehicles and may be implemented as smart windows that show a background or display an image.

The transparent display device may be implemented as an OLED display device. In this case, the transparent display device may be divided into transmitting portions that transmit incident light as it is and light emitting portions that emit light. When the light emitting portions do not emit light, a user may view a background at the back of the transparent display device through the transmitting portions, and, when the light emitting portions emit light, the user may view an image displayed by the light emitting portions.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide a high-resolution display device.

It should be noted that objects of the disclosure are not limited to the above-mentioned objects, and other objects may and should be clearly understood within the spirit and scope of the disclosure by those skilled in the art from the following descriptions.

A display device according to an embodiment may include light transmitting areas including a first light transmitting area, and light emitting areas disposed around the light transmitting areas and including a first light emitting area disposed around the first light transmitting area. The first light emitting area may include a first-first light emitting area disposed adjacent to a first portion of each of the light transmitting areas, a first-second light emitting area disposed adjacent to a second portion of each of the light transmitting areas, a first-third light emitting area disposed adjacent to a third portion of each of the light transmitting areas, and a first-fourth light emitting area disposed adjacent to a fourth portion of each of the light transmitting areas. The first-first to first-fourth light emitting areas may include at least one of a first light emitting portion that emits light of a first color, a second light emitting portion that emits light of a second color, and a third light emitting portion that emits light of a third color. At least two light emitting areas of the first-first to first-fourth light emitting areas may include at least two light emitting portions among the first light emitting portion, the second light emitting portion, and the third light emitting portion.

The first-first to first-fourth light emitting areas may each include the first light emitting portion, the second light emitting portion, and the third light emitting portion.

The first light transmitting area may include a first side disposed at the first portion, a second side disposed at the second portion, a third side disposed at the third portion, and a fourth side disposed at the fourth portion, wherein the first-first light emitting area may be disposed adjacent to the first side, the first-second light emitting area may be disposed adjacent to the second side, the first-third light emitting area may be disposed substantially adjacent to the third side, and the first-fourth light emitting area may be disposed adjacent to the fourth side.

The light transmitting areas may include a second light transmitting area disposed adjacent to the first portion of the first light transmitting area, a third light transmitting area disposed substantially adjacent to the second portion of the first light transmitting area, a fourth light transmitting area disposed adjacent to the third portion of the first light transmitting area, and a fifth light transmitting area disposed adjacent to the fourth portion of the first light transmitting area, wherein the first-first light emitting area may be disposed between the first light transmitting area and the second light transmitting area, the first-second light emitting area may be disposed between the first light transmitting area and the third light transmitting area, the first-third light emitting area may be disposed between the first light transmitting area and the fourth light transmitting area, and the first-fourth light emitting area may be disposed between the first light transmitting area and the fifth light transmitting area.

The first light emitting area may further include a first-fifth light emitting area disposed approximate to a corner portion of the first light transmitting area. The first-first to first-fourth light emitting areas each may include the first light emitting portion and the second light emitting portion. The third light emitting portion may be disposed in the first-fifth light emitting area.

A separation distance between the first light emitting portion and the second light emitting portion which are adjacent to each other may be substantially smaller than a separation distance between the second light emitting portion and the third light emitting portion which are adjacent to each other.

The first-first light emitting area and the first-third light emitting area may each include the first light emitting portion, the second light emitting portion, and the third light emitting portion, and the first-second light emitting area and the first-fourth light emitting area may each include the second light emitting portion.

The display device may further include a first substrate, a second substrate disposed opposite to the first substrate, and a light emitting element disposed between the first substrate and the second substrate and disposed in each light emitting area, wherein the light emitting element may include a pixel electrode disposed in each light emitting area, a common electrode disposed opposite to an anode electrode, and an organic light emitting layer disposed between the pixel electrode and the common electrode.

The first substrate may be a display substrate, and the second substrate may be an encapsulation substrate.

The display device may further include a bank layer which may partially cover the pixel electrode and include a black organic film, wherein the bank layer may not be disposed in the light transmitting areas.

The first substrate and the second substrate may be coupled to each other along at least one edge of the display device.

The common electrode may not be disposed in the light transmitting areas.

The display device may further include a first substrate and a light emitting element disposed in each light emitting area on the first substrate, wherein the light emitting element may include a pixel electrode disposed in each light emitting area, a common electrode disposed opposite to an anode electrode, and an organic light emitting layer disposed between the pixel electrode and the common electrode.

The display device may further include a first inorganic encapsulation film disposed on the light emitting element, an organic encapsulation film disposed on the first inorganic encapsulation film, and a second inorganic encapsulation film disposed on the organic encapsulation film.

A display device according to an embodiment may include light transmitting areas including a first light transmitting area, and light emitting areas disposed around the light transmitting areas and including a first light emitting area disposed around the first light transmitting area. The first light emitting area may include a first-first light emitting area and a first-second light emitting area disposed adjacent to a first portion of the first light transmitting area, and a first-third light emitting area and a first-fourth light emitting area disposed adjacent to a second portion of the first light transmitting area that is disposed at an opposite side of the first portion with the first light transmitting area disposed therebetween. The first-first to first-fourth light emitting areas each may include a first light emitting portion that emits light of a first color, a second light emitting portion that emits light of a second color, and a third light emitting portion that emits light of a third color.

The first light emitting portion and the second light emitting portion of each light emitting area may be disposed in a first direction, and the third light emitting portion may be disposed in a second direction intersecting with the first direction.

A width of the first light transmitting area in the first direction may gradually increase toward a central portion.

The first-first to first-fourth light emitting areas may not be disposed around the central portion of the first light transmitting area.

The display device may further include a display substrate, an encapsulation substrate disposed opposite to the display substrate, and a light emitting element disposed between the display substrate and the encapsulation substrate and disposed in each light emitting area, wherein the light emitting element may include a pixel electrode disposed in each light emitting area, a common electrode disposed opposite to an anode electrode, and an organic light emitting layer disposed between the pixel electrode and the common electrode.

The display device may further include a bank layer which may partially cover the pixel electrode and include a black organic film, wherein the bank layer may not be disposed in the light transmitting areas.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
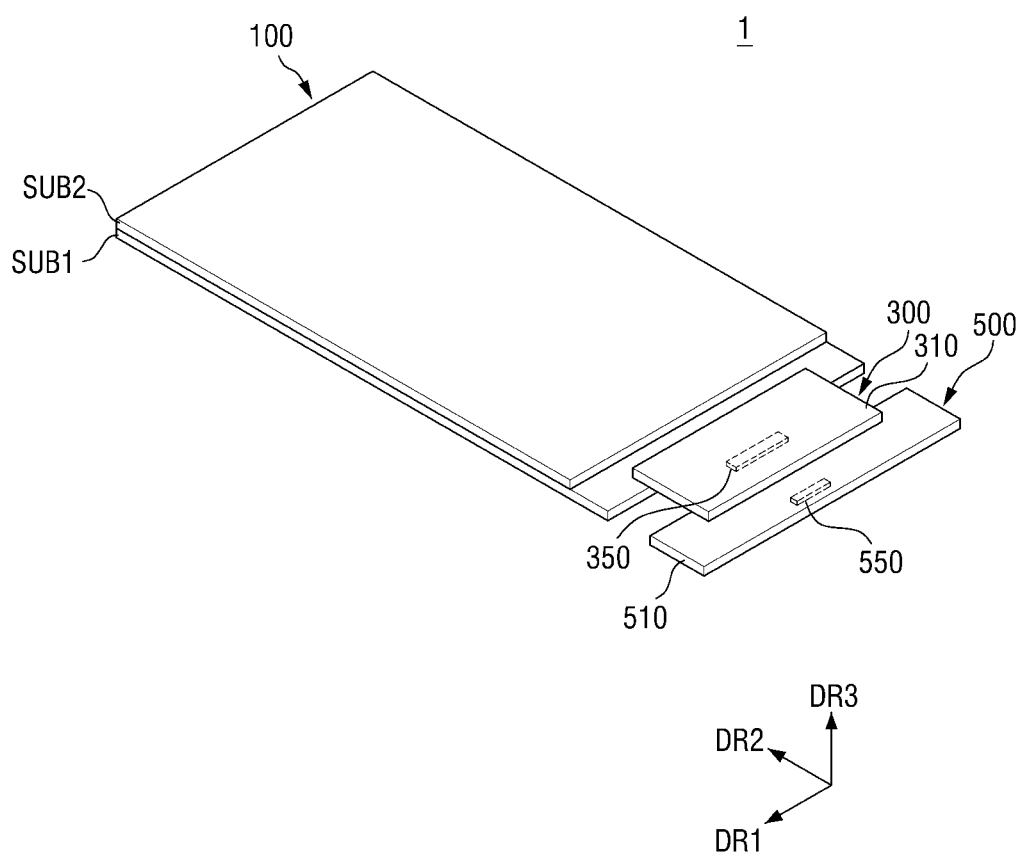
FIG. 1 is a perspective view of a display device according to an embodiment.

Although the disclosure may be modified in various manners and have additional embodiments, embodiments are illustrated in the accompanying drawings and will be mainly described in the specification. However, the scope of the disclosure is not limited to the embodiments in the accompanying drawings and the specification and should be construed as including all the changes, equivalents and substitutions included in the spirit and scope of the disclosure.

Some of the parts which are not associated with the description may not be provided in order to describe embodiments of the disclosure and like reference numerals refer to like elements throughout the specification.

In the drawings, sizes and thicknesses of elements may be enlarged for better understanding clarity and ease of description thereof. However, the disclosure is not limited to the illustrated sizes and thicknesses. In the drawings, the thicknesses of layers, films, panels, regions, and other elements, may be exaggerated for clarity. In the drawings, for better understanding and ease of description, the thicknesses of some layers and areas may be exaggerated.

Further, in the specification, the phrase "in a plan view" means when an object portion is viewed from above, and the phrase "in a schematic cross-sectional view" means when a schematic cross-section taken by vertically cutting an object portion is viewed from the side.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

When a layer, film, region, substrate, or area, is referred to as being "on" another layer, film, region, substrate, or area, it may be directly on the other film, region, substrate, or area, or intervening films, regions, substrates, or areas, may be present therebetween. Conversely, when a layer, film, region, substrate, or area, is referred to as being "directly on" another layer, film, region, substrate, or area, intervening layers, films, regions, substrates, or areas, may be absent therebetween. Further when a layer, film, region, substrate, or area, is referred to as being "below" another layer, film, region, substrate, or area, it may be directly below the other layer, film, region, substrate, or area, or intervening layers, films, regions, substrates, or areas, may be present therebetween. Conversely, when a layer, film, region, substrate, or area, is referred to as being "directly below" another layer, film, region, substrate, or area, intervening layers, films, regions, substrates, or areas, may be absent therebetween. Further, "over" or "on" may include positioning on or below an object and does not necessarily imply a direction based upon gravity The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Throughout the specification, when an element is referred to as being "connected" to another element, the element may be "directly connected" to another element, or "electrically connected" to another element with one or more intervening elements interposed therebetween. It will be further understood that when the terms "comprises," "comprising," "includes" and/or "including" are used in this specification, they or it may specify the presence of stated features, integers, steps, operations, elements and/or components, but do not preclude the presence or addition of other features, integers, steps, operations, elements, components, and/or any combination thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 5% of the stated value.

Although terms such as first and second are used to describe various elements, the elements are not limited by such terms. Such terms are merely used to differentiate one element from another element. Therefore, a first element mentioned below may also be a second element within the spirit and scope of the disclosure.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Hereinafter, embodiments will be described with reference to the accompanying drawings.

Figure 2:
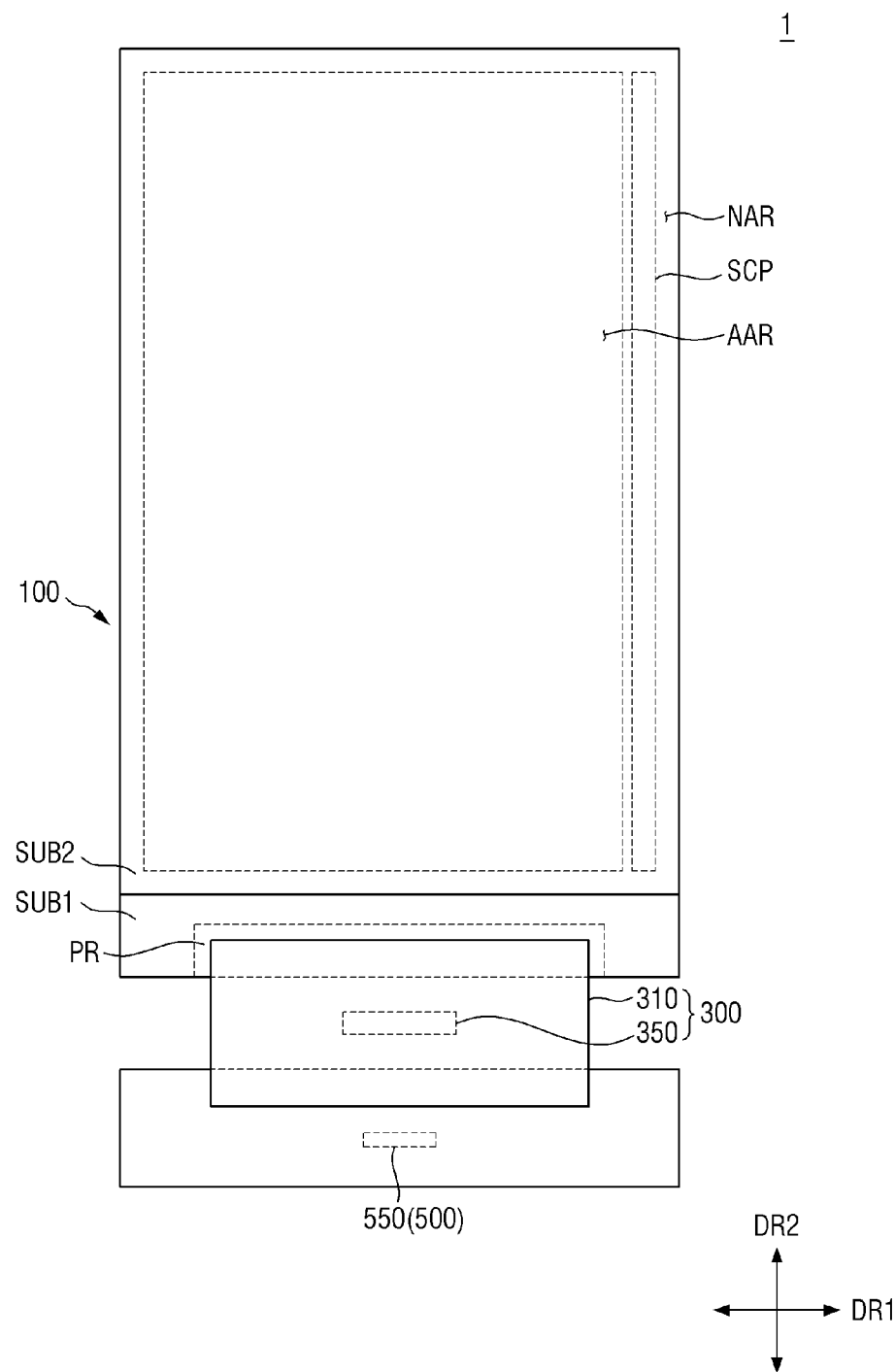
FIG. 2 is a plan view of the display device of FIG. 1.

FIG. 1 is a perspective view of a display device according to an embodiment, and FIG. 2 is a plan view of the display device of FIG. 1.

Referring to FIGS. 1 and 2, a display device 1 may include a display panel 100 to display an image, a printed circuit board 300 connected to the display panel 100, and a main circuit board 500 connected to the printed circuit board 300.

Although the display panel 100 may be an organic light emitting display panel as an example only for the description purpose, embodiments are not limited thereto. Other types of display panels such as a liquid crystal display (LCD) panel, a quantum dot organic light emitting diode (QD-OLED) display panel, a quantum dot liquid crystal display (LCD) panel, and a micro LED panel may also be applied as the display panel 100.

The display panel 100 may include an active area AAR including pixel areas, and a non-active area NAR disposed around the active area AAR. The active area AAR may have, for example, a rectangular shape with right-angled corners or rounded corners in a plan view. The active area AAR may have short sides and long sides. The short side of the active area AAR may be a side extending in a first direction DR1. The long side of the active area AAR may be a side extending in a second direction DR2. However, the shape of the active area AAR in the plan view is not limited to the rectangular shape, and the active area AAR may also have a circular shape, an elliptical shape, or various other shapes within the spirit and scope of the invention. The non-active area NAR may be disposed adjacent to both short sides and both long sides of the active area AAR. In this case, the non-active area NAR may surround all the sides of the active area AAR and constitute the boundary of the active area AAR. However, embodiments are not limited thereto, and the non-active area NAR may also be disposed adjacent to only the short sides or the long sides of the active area AAR.

The non-active area NAR of the display panel 100 may include a pad area PR to which the printed circuit board 300 is attached. For example, the pad area PR may be disposed around one short side of the active area AAR. However, embodiments are not limited thereto, and the pad area PR may also be disposed around both short sides of the active area AAR or disposed around both short sides and both long sides of the active area AAR. Pads such as data pads may be formed in the pad area PR of the display panel 100. Wires to connect the pads and driving integrated circuits 350 to each other and wires to connect the pads and wires of the main circuit board 500 to each other may be formed in the printed circuit board 300. The printed circuit board 300 may be attached onto the pads using an anisotropic conducting film, and thus, the pads and the wires of the printed circuit board 300 may be connected to each other.

The non-active area NAR may include a scan driver SCP disposed at one long side of the active area AAR. The scan driver SCP supplies gate signals to gate lines according to a gate control signal input from a timing controller 550 which will be described below. The scan driver SCP may be directly formed in the non-active area NAR at one outer side or both outer sides of the active area AAR of the display panel 100 or may be manufactured as a driving chip, mounted on a flexible film, and attached to the non-active area NAR at one outer side or both outer sides of the active area AAR of the display panel 100.

The printed circuit board 300 may include a printed base film 310 and the driving integrated circuit 350 disposed on the printed base film 310. The printed base film 310 may be formed to include an insulating material.

For example, the driving integrated circuit 350 may be a data driving integrated circuit. The driving integrated circuit 350 may receive digital video data and a source control signal from the timing controller 550. The driving integrated circuit 350 may convert the digital video data to analog data voltages according to the source control signal and may supply the analog data voltages to data lines. The driving integrated circuit 350 may be implemented as a driving chip and mounted on the printed base film 310 using the chip-on-film (COF) method as illustrated in FIG. 2 or directly mounted on the display panel 100 using the chip-on-plastic (COP) method.

The main circuit board 500 may be attached to the printed circuit board 300. Circuits implemented using driving chips may be mounted on the main circuit board 500. For example, the timing controller 550 may be mounted on the main circuit board 500. The main circuit board 500 may be a printed circuit board or a flexible printed circuit board.

The timing controller 550 may receive digital video data and a timing signal from an external system board via a cable of the main circuit board 500. Based on the timing signal, the timing controller 550 may generate a gate control signal for controlling an operation timing of the scan driver SCP and a source control signal for controlling the driving integrated circuits 350. The timing controller 550 may supply the gate control signal to the scan driver SCP and supply the source control signal to the driving integrated circuits 350.

The display panel 100 may include a first substrate SUB1 and a second substrate SUB2 disposed opposite to the first substrate SUB1. The first substrate may be a display substrate including a light emitting element disposed in each pixel area, and the second substrate SUB2 may be an encapsulation substrate encapsulating the light emitting element. The first substrate SUB1 and the second substrate SUB2 may be formed of plastic or glass.

In the embodiments, the first direction DR1 and the second direction DR2 are different directions which may intersect each other. For example, the first direction DR1 and the second direction DR2 indicate directions which intersect perpendicularly in the plan view. A third direction DR3 is a direction intersecting a plane on which the first direction DR1 and the second direction DR2 are placed. For example, the third direction DR3 indicates a direction which intersects perpendicularly with both the first direction DR1 and the second direction DR2. In the illustrated drawings, the first direction DR1 indicates a horizontal direction of the display device 1, the second direction DR2 indicates a vertical direction of the display device 1, and the third direction DR3 indicates a thickness direction of the display device 1. In the following embodiments, it may be understood that one side in the first direction DR1 indicates a rightward direction in the plan view, the other side in the first direction DR1 indicates a leftward direction in the plan view, one side in the second direction DR2 indicates an upward direction in the plan view, the other side in the second direction DR2 indicates a downward direction in the plan view, one side in the third direction DR3 indicates an upward direction in a schematic cross-sectional view, and the other side in the third direction DR3 indicates a downward direction in the schematic cross-sectional view. However, the directions, one side, and the other side mentioned in the description of embodiments should be understood as relative directions, and the embodiments are not limited by the mentioned directions.

The size of the first substrate SUB1 in the plan view may be larger than the size of the second substrate SUB2 in the plan view. The first substrate SUB1 may have a shape substantially protruding beyond one side of the second substrate SUB2. For example, a short side of the first substrate SUB1 may have a shape substantially protruding beyond a short side of the second substrate SUB2 in the second direction DR2. In other words, the short side of the second substrate SUB2 may have a shape that is substantially indented compared with the short side of the first substrate SUB1 in the second direction DR2. The above-described pad area PR may be disposed in a portion of the first substrate SUB1 protruding beyond the second substrate SUB2. The pad area PR and the printed circuit board 300 may be coupled to each other.

Figure 3:
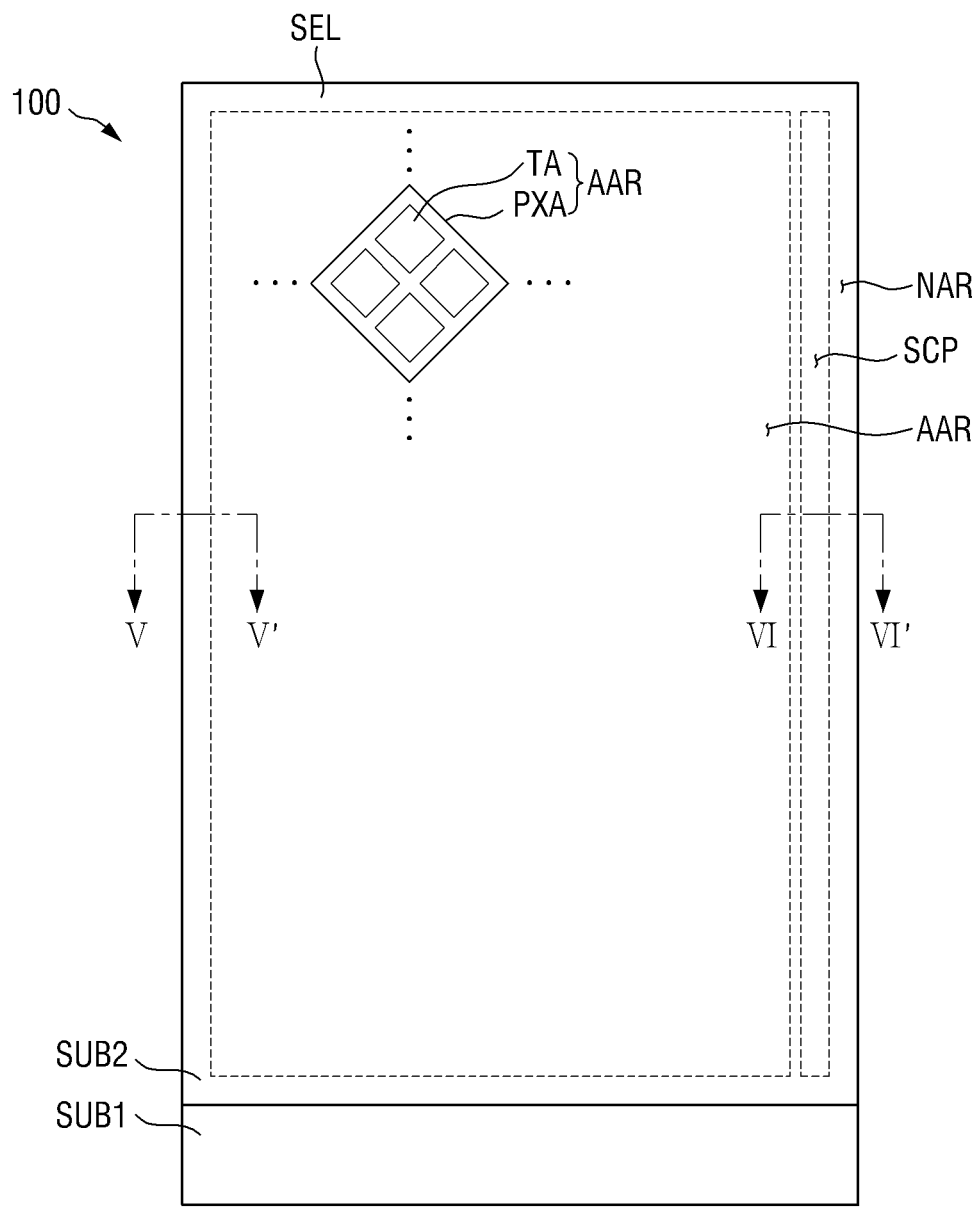
FIG. 3 is a plan view illustrating a display panel of the display device according to an embodiment.
Figure 3:
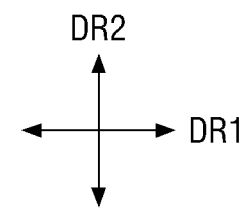

FIG. 3 is a plan view illustrating a display panel of the display device according to an embodiment.

Referring to FIG. 3, an active area AAR of a display panel 100 may include light transmitting areas TA and a pixel area PXA. In the embodiment of FIG. 3, as an example, the pixel area PXA may be disposed around the light transmitting areas TA. However, a pixel area of the display device may have different structures or configuration in other embodiments. The light transmitting area TA may be an area from which light is not emitted in the display device 1. The pixel area PXA may include a light emitting area which emits light and a non-light emitting area which is disposed around the light emitting area and does not emit light. Although both the light transmitting area TA and the non-light emitting area of the pixel area PXA do not emit light, the light transmitting area TA and the non-light emitting area may be differentiated from each other in that, while organic layers including a bank layer of the display panel 100 are disposed in the non-light emitting area identically as in the light-emitting area, the organic layers including the bank layer may not be disposed in the light transmitting area TA.

Although not illustrated in the drawings, a black matrix may be disposed on the display panel 100. The black matrix may be disposed to overlap the non-light emitting area and disposed not to overlap the light transmitting areas TA and the light emitting area.

The light transmitting areas TA may refer to multiple light transmitting areas spaced apart from each other. The pixel area PXA may be disposed around the light transmitting areas spaced apart from each other and disposed between the light transmitting areas spaced apart from each other.

As illustrated in FIG. 3, each light transmitting area TA may have a substantially rhombus shape in the plan view. Each light transmitting area TA may have four sides extending in diagonal directions with respect to the first direction DR1 and the second direction DR2. The light transmitting areas TA may be arranged in the first direction DR1 and the second direction DR2. Although four light transmitting areas TA are disposed in the pixel area PXA in the embodiment of FIG. 3, embodiments are not limited thereto. In other embodiments, a larger number of light transmitting areas TA may be disposed.

The light transmitting areas TA may be disposed adjacent to each other such that the above-mentioned four sides of the respective light transmitting areas TA are adjacent to each other. The pixel area PXA may be disposed between the light transmitting areas TA which are disposed adjacent to each other. The pixel area PXA may be disposed between the adjacent sides of the respective light transmitting areas TA which are also adjacent to each other.

A sealing member SEL may be disposed in the non-active area NAR of the display panel 100. The sealing member SEL may be disposed between the first substrate SUB1 and the second substrate SUB2, may couple the first substrate SUB1 and the second substrate SUB2 to each other, and may have sealing material which prevents impurities such as moisture and oxygen from being permeated from the outside to a portion between the first substrate SUB1 and the second substrate SUB2.

The sealing member SEL may be disposed along the boundary portion of the second substrate SUB2 in the plan view. For example, the sealing member SEL may be disposed along the boundary portion of the overlapping area between the first substrate SUB1 and the second substrate SUB2 and may not be disposed in the portion of the first substrate SUB1 that protrudes beyond the second substrate SUB2. The sealing member SEL may be formed to include sealing material such as glass frit, for example. The sealing member SEL may be formed by disposing the sealing material between the first substrate SUB1 and the second substrate SUB2. The sealing material may be irradiated with laser to melt or soften the sealing material.

Figure 4:
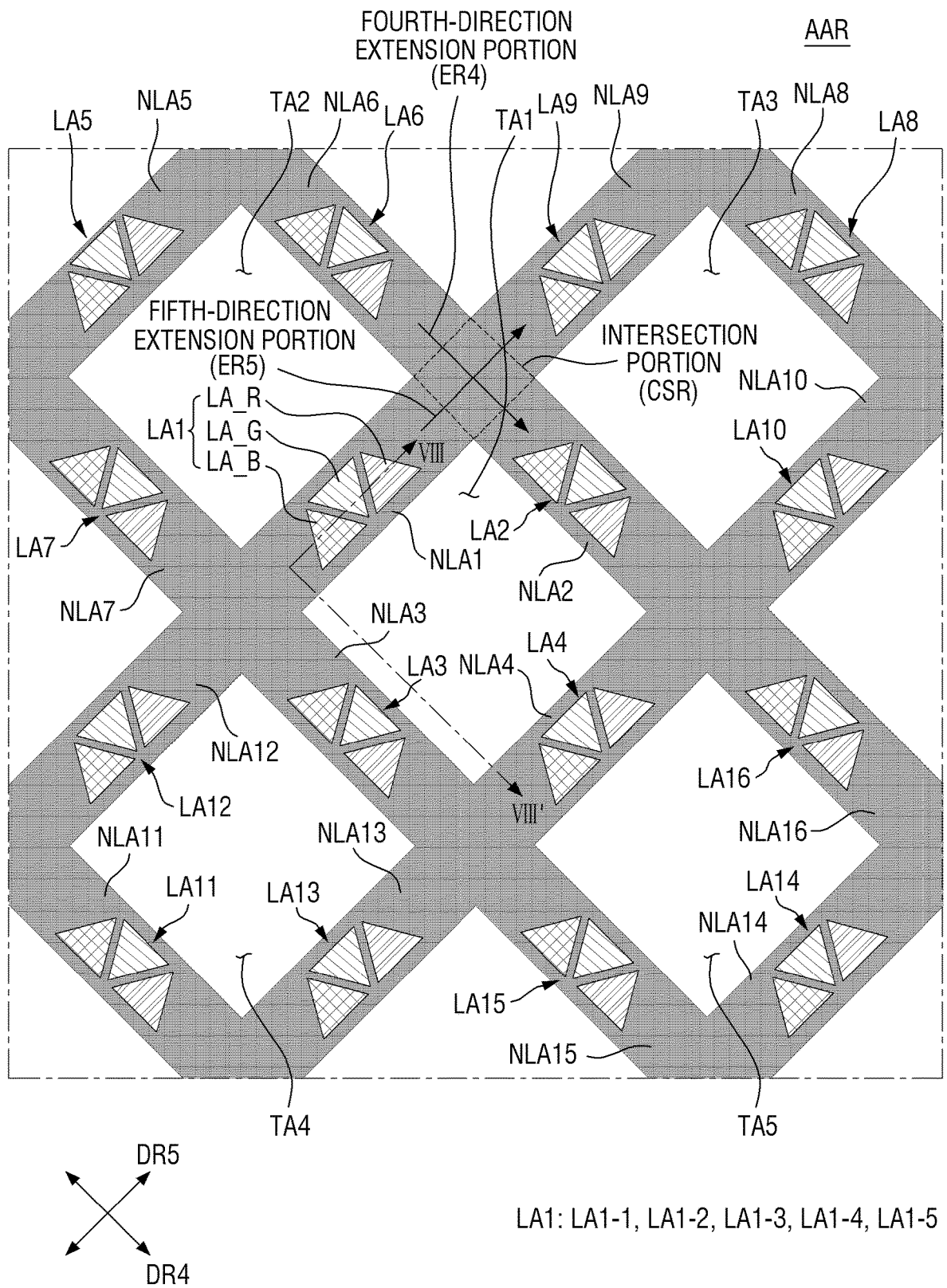
FIG. 4 is a plan arrangement view illustrating an active area of a display panel according to an embodiment.
Figure 5:
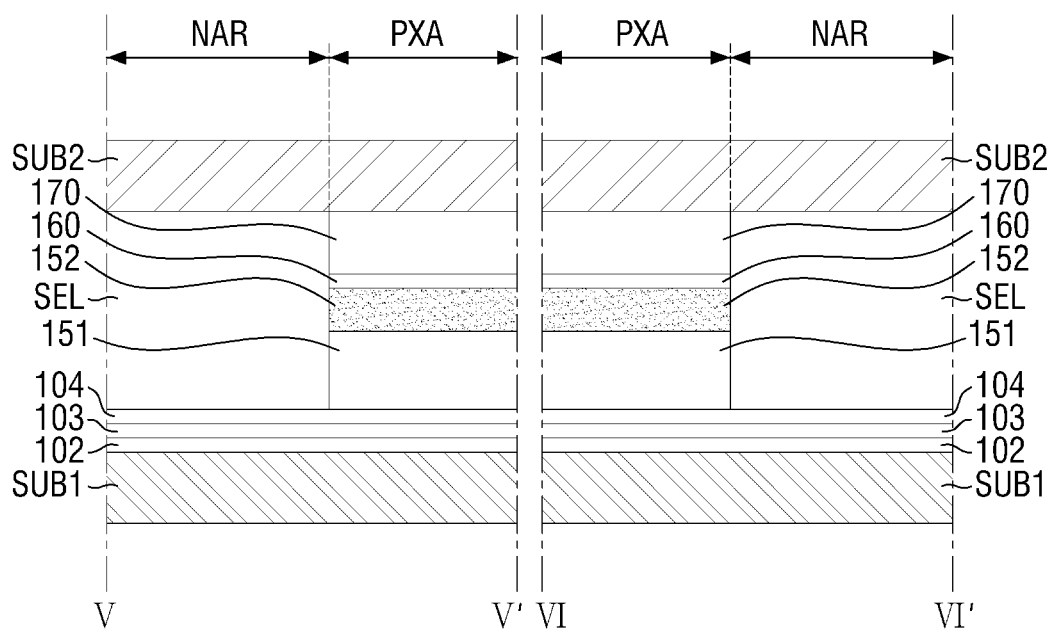
FIG. 5 is a schematic cross-sectional view taken along line V-V' and line VI-VI' of FIG. 3.
Figure 6:
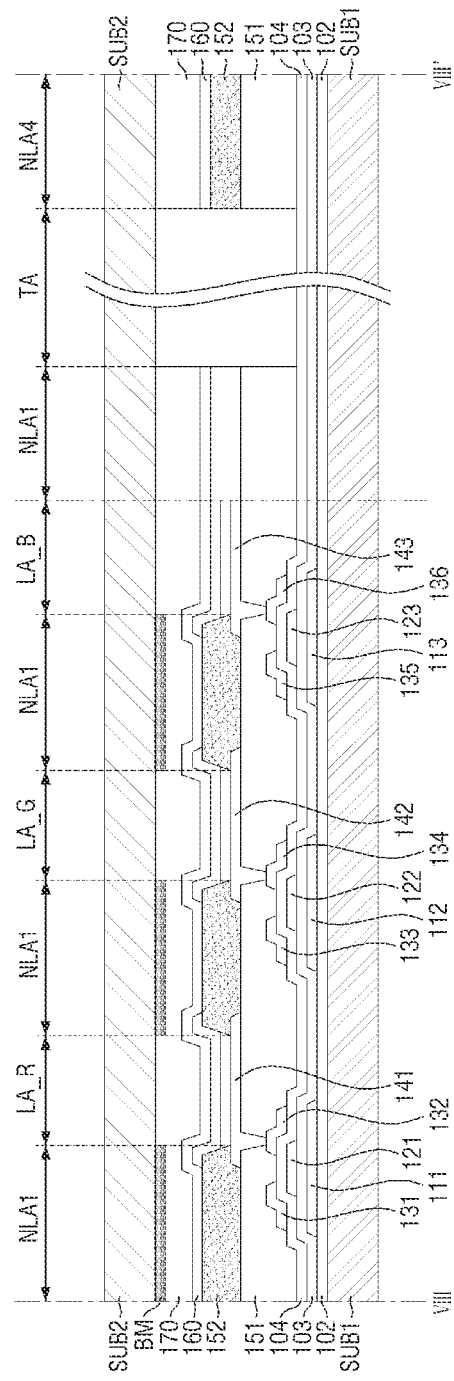
FIG. 6 is a schematic cross-sectional view taken along line VIII-VIII' of FIG. 4.

FIG. 4 is a plan arrangement view illustrating an active area of a display panel according to an embodiment, FIG. 5 is a schematic cross-sectional view taken along line V-V' and line VI-VI' of FIG. 3, and FIG. 6 is a schematic cross-sectional view taken along line VIII-VIII' of FIG. 4.

Referring to FIGS. 4 to 6, an active area AAR of a display panel 100 according to an embodiment may include light transmitting areas TA1 to TA5 and a pixel area PXA disposed between the light transmitting areas TA1 to TA5. The pixel area PXA may refer to multiple pixel areas which may be disposed around the light transmitting areas and between the adjacent sides of the respective light transmitting areas which are adjacent to each other. The pixel areas each may include a light emitting area from which light is emitted and a non-light emitting area which does not emit light. In an embodiment, the pixel areas may be defined as areas other than the light transmitting areas. Light emitting areas of the pixel areas may be disposed around the light transmitting areas TA1 to TA5.

In an embodiment, a fourth direction DR4 and a fifth direction DR5 may be different directions which may intersect each other. For example, the fourth direction DR4 and the fifth direction DR5 indicate directions which intersect perpendicularly in the plan view. In the illustrated drawings, the fourth direction DR4 and the fifth direction DR5 refer to directions extending in the diagonal directions with respect to the first direction DR1 and the second direction DR2. Of the diagonal directions with respect to the first direction DR1 and the second direction DR2, the fourth direction DR4 extends from the other side in the first direction DR1 and the other side in the second direction DR2 to one side in the first direction DR1 and one side in the second direction DR2. Of the diagonal directions with respect to the first direction DR1 and the second direction DR2, the fifth direction DR5 extends from the other side in the first direction DR1 and the one side in the second direction DR2 to the one side in the first direction DR1 and the other side in the second direction DR2. In the embodiment of FIG. 4, as an example, one side in the fourth direction DR4 indicates an upper right direction in the plan view, the other side in the fourth direction DR4 indicates a lower left direction in the plan view, one side in the fifth direction DR5 indicates an upper left direction in the plan view, and the other side in the fifth direction DR5 indicates a lower right direction in the plan view. However, the directions mentioned in the embodiments should be understood as relative directions, and the embodiments are not limited by the above-described directions.

The light transmitting areas TA1 to TA5 may each have a substantially rhombus shape in the plan view and thus have the four sides as described above.

The sizes of the light transmitting areas TA1 to TA5 may be substantially the same in the plan view. However, embodiments are not limited thereto, and the light transmitting areas TA1 to TA5 may have different sizes in the plan view.

The first light transmitting area TA1 may include a first portion TA1P1, for example, a first transmitting side disposed at the other side in the fifth direction DR5, a second portion TA1P2, for example, a second transmitting side disposed at the one side in the fourth direction DR4, a third portion TA1P3, for example, a third transmitting side disposed at the other side in the fourth direction DR4, and a fourth portion TAP1P4, for example, a fourth transmitting side disposed at the other side in the fifth direction DR5. The first transmitting side and the third transmitting side may be disposed opposite to each other and be substantially parallel to each other. The second transmitting side and the fourth transmitting side may be disposed opposite to each other and be substantially parallel to each other.

The second light transmitting area TA2 may be disposed adjacent to the first transmitting side of the first light transmitting area TA1, the third light transmitting area TA3 may be disposed adjacent to the second transmitting side of the first light transmitting area TA1, the fourth light transmitting area TA4 may be disposed adjacent to the third transmitting side of the first light transmitting area TA1, and the fifth light transmitting area TA5 may be disposed adjacent to the fourth transmitting side of the first light transmitting area TA1.

The pixel area PXA may have a shape extending along a fourth-direction extension portion ER4 and a fifth-direction extension portion ER5 in the plan view. The pixel area PXA may include, for example, a first pixel area disposed between the first light transmitting area TA1 and the second light transmitting area TA2, a second pixel area disposed between the first light transmitting area TA1 and the third light transmitting area TA3, a third pixel area disposed between the first light transmitting area TA1 and the fourth light transmitting area TA4, and a fourth pixel area disposed between the first light transmitting area TA1 and the fifth light transmitting area TA5. The first pixel area may include a first light emitting area LA1 and a first non-light emitting area NLA1 disposed around the first light emitting area LA1, the second pixel area may include a second light emitting area LA2 and a second non-light emitting area NLA2 disposed around the second light emitting area LA2, the third pixel area may include a third light emitting area LA3 and a third non-light emitting area NLA3 disposed around the third light emitting area LA3, and the fourth pixel area may include a fourth light emitting area LA4 and a fourth non-light emitting area NLA4 disposed around the fourth light emitting area LA4.

The first light emitting area LA1 to the fourth light emitting area LA4 may be disposed at central areas of the first transmitting side to the fourth transmitting side of the first light transmitting area TA1. For example, separation distances between adjacent light emitting areas among the light emitting areas LA1 to LA4 may be substantially equal to each other. However, embodiments are not limited thereto, and the separation distances between adjacent light emitting areas among the light emitting areas LA1 to LA4 may be different from each other.

In the display device 1 according to an embodiment, a light emitting area may not be disposed at an intersection portion CSR where the fourth-direction extension portion ER4 and the fifth-direction extension portion ER5 intersect each other.

The light emitting areas LA1 to LA4 may each include a first light emitting portion LA_R to emit light of a first color, a second light emitting portion LA_G to emit light of a second color, and a third light emitting portion LA_B to emit light of a third color. For example the first light emitting area LA1 may include a first-first light emitting area LA1-1 disposed adjacent to a first portion of each of the light transmitting areas, a first-second light emitting area LA1-2 disposed adjacent to a second portion of each of the light transmitting areas, a first-third light emitting area LA1-3 disposed adjacent to a third portion of each of the light transmitting areas and a first-fourth light emitting area LA1-4 disposed adjacent to a fourth portion of each of the light transmitting areas. The first-first to first-fourth light emitting areas LA1-1, LA1-2, LA1-3, and LA1-4 may each include at least one of a first light emitting portion LA_R that emits light of a first color, a second light emitting portion LA_G that emits light of a second color and a third light emitting portion LA_B that emits light of a third color. The first light emitting area LA1 may further include a first-fifth light emitting area LA1-5. At least two light emitting areas of the first-first to first-fourth light emitting areas LA1-1 to LA1-4 may include at least two light emitting portions among the first light emitting portion, the second light emitting portion, and the third light emitting portion.

The first light emitting area LA1, a fifth light emitting area LA5, a sixth light emitting area LA6, and a seventh light emitting area LA7 may be disposed around the second light transmitting area TA2. Similar to the first light emitting area LA1, the fifth light emitting area LA5 to the seventh light emitting area LA7 may each include the first light emitting portion LA_R, the second light emitting portion LA_G, and the third light emitting portion LA_B.

The first light emitting area LA1 may be disposed between the second light transmitting area TA2 and the first light transmitting area TA1.

The fifth light emitting area LA5 may be disposed adjacent to a first portion of the second light transmitting area TA2, the sixth light emitting area LA6 may be disposed adjacent to a second portion of the second light transmitting area TA2, the seventh light emitting area LA7 may be disposed adjacent to a third portion of the second light transmitting area TA2, and the first light emitting area LA1 may be disposed adjacent to a fourth portion of the second light transmitting area TA2.

The second light emitting area LA2, an eighth light emitting area LA8, a ninth light emitting area LA9, and a tenth light emitting area LA10 may be disposed around the third light transmitting area TA3. Similar to the second light emitting area LA2, the eighth light emitting area LA8 to the tenth light emitting area LA10 may each include the first light emitting portion LA_R, the second light emitting portion LA_G, and the third light emitting portion LA_B.

The second light emitting area LA2 may be disposed between the third light transmitting area TA3 and the first light transmitting area TA1.

The eighth light emitting area LA8 may be disposed adjacent to a second portion of the third light transmitting area TA3, the ninth light emitting area LA9 may be disposed adjacent to the first portion of the second light transmitting area TA2, the tenth light emitting area LA10 may be disposed adjacent to the fourth portion of the second light transmitting area TA2, and the second light emitting area LA2 may be disposed adjacent to a third portion of the third light transmitting area TA3.

The third light emitting area LA3, an eleventh light emitting area LA11, a twelfth light emitting area LA12, and a thirteenth light emitting area LA13 may be disposed around the fourth light transmitting area TA4. Similar to the third light emitting area LA3, the eleventh light emitting area LA11 to the thirteenth light emitting area LA13 may each include the first light emitting portion LA_R, the second light emitting portion LA_G, and the third light emitting portion LA_B.

The third light emitting area LA3 may be disposed between the fourth light transmitting area TA4 and the first light transmitting area TA1.

The eleventh light emitting area LA11 may be disposed adjacent to a third portion of the fourth light transmitting area TA4, the twelfth light emitting area LA12 may be disposed adjacent to a first portion of the fourth light transmitting area TA4, the thirteenth light emitting area LA13 may be disposed adjacent to a fourth portion of the fourth light transmitting area TA4, and the third light emitting area LA3 may be disposed adjacent to a second portion of the fourth light transmitting area TA4.

The fourth light emitting area LA4, a fourteenth light emitting area LA14, a fifteenth light emitting area LA15, and a sixteenth light emitting area LA16 may be disposed around the fifth light transmitting area TA5. Similar to the fourth light emitting area LA4, the fourteenth light emitting area LA14 to the sixteenth light emitting area LA16 may each include the first light emitting portion LA_R, the second light emitting portion LA_G, and the third light emitting portion LA_B.

The fourth light emitting area LA4 may be disposed between the fifth light transmitting area TA5 and the first light transmitting area TA1.

The fourteenth light emitting area LA14 may be disposed adjacent to a fourth portion of the fifth light transmitting area TA5, the fifteenth light emitting area LA15 may be disposed adjacent to a third portion of the fifth light transmitting area TA5, the sixteenth light emitting area LA16 may be disposed adjacent to a second portion of the fifth light transmitting area TA5, and the fourth light emitting area LA4 may be disposed adjacent to a first portion of the fifth light transmitting area TA5.

Hereinafter, the light emitting portions will be described based on the first light emitting area LA1.

The first color, the second color, and the third color may be colors different from each other. The first to third colors may be any one of red, green, and blue. For example, the first light emitting portion LA_R may be a red light emitting portion, the second light emitting portion LA_G may be a green light emitting portion, and the third light emitting portion LA_B may be a blue light emitting portion. However, embodiments are not limited thereto, and the first light emitting portion LA_R may be the green light emitting portion or the blue light emitting portion, the second light emitting portion LA_G may be a light emitting portion that emits light of a different color from the light emitted by the first light emitting portion LA_R, and the third light emitting portion LA_B may be a light emitting portion that emits light of a different color from the lights emitted by the first and second light emitting portions LA_R and LA_G. In the following embodiments, for convenience of description, description will be given based on the case in which the red light emitting portion, the green light emitting portion, and the blue light emitting portion are arranged in that order in a direction from one side to the other side in the fourth direction DR4.

In some embodiments, each of the light emitting areas LA1 to LA4 may include a fourth light emitting portion that emits light of a fourth color. The fourth color may be white. The fourth light emitting portion may be disposed between the first light emitting portion LA_R and the second light emitting portion LA_G, disposed between the second light emitting portion LA_G and the third light emitting portion LA_B, disposed at the one side in the fourth direction DR4 from the first light emitting portion LA_R, or disposed at the other side in the fourth direction DR4 from the third light emitting portion LA_B.

Each of the light emitting portions LA_R, LA_G, and LA_B may have a substantially triangular shape in the plan view. However, embodiments are not limited thereto, and each of the light emitting portions LA_R, LA_G, and LA_B may also have other substantially polygonal shapes or other shapes such as a substantially circular shape and a substantially elliptical shape in the plan view.

When each of the light emitting portions LA_R, LA_G, and LA_B has a substantially triangular shape in the plan view, the light emitting portions LA_R, LA_G, and LA_B may be arranged such that one side of each light emitting portion faces one side of another light emitting portion adjacent thereto. For example, one side of the first light emitting portion LA_R may face one side of the second light emitting portion LA_G, and another side of the second light emitting portion LA_G that is different from the one side of the second light emitting portion LA_G may face one side of the third light emitting portion LA_B. In this way, the light emitting portions LA_R, LA_G, and LA_B may be arranged such that separation distances therebetween are minimized within a limited light emitting area.

The sizes of the light emitting portions LA_R, LA_G, and LA_B may be substantially the same in the plan view. However, embodiments are not limited thereto, and the sizes of the light emitting portions LA_R, LA_G, and LA_B in the plan view may be different from each other, or the sizes of any two may be the same or substantially the same while the size of the remaining one is different in the plan view.

The non-light emitting area NLA may have a black bank layer and a black matrix disposed thereon so that output of light from the corresponding area may be prevented. The first non-light emitting area NLA1 may have a shape surrounding the first light emitting area LA1 in the plan view. The first non-light emitting area NLA1 may be disposed between the first light emitting portion LA_R and the second light emitting portion LA_G and between the second light emitting portion LA_G and the third light emitting portion LA_B and may completely surround the first light emitting area LA1. For example, the first light emitting area LA1 may be completely surrounded by the first non-light emitting area NLA1.

The active area AAR may be formed by grouping a single light transmitting area and two light emitting areas together. For example, the active area AAR may be formed by grouping the first light emitting area LA1 and the second light emitting area LA2 with the first light transmitting area TA1 and grouping the third light emitting area LA3 and the fourth light emitting area LA4 with the second light transmitting area TA2. However, embodiments are not limited thereto, and the first light emitting area LA1 and the third light emitting area LA3 may be grouped with the first light transmitting area TA1, the second light emitting area LA2 and the fourth light emitting area LA4 may be grouped with the first light transmitting area TA1, or the third light emitting area LA3 and the fourth light emitting area LA4 may be grouped with the first light transmitting area TA1.

Since the active area AAR according to an embodiment is formed by grouping a single light transmitting area and two light emitting areas together, a larger number of light emitting areas may be disposed in the pixel area PXA which is limited, and thus it is possible to implement the display device 1 in high resolution.

Also, since three light emitting portions that emit lights of different colors are disposed in each light emitting area, a separation distance between adjacent light emitting portions which emit lights of the same color is decreased, and thus it is possible to achieve high color reproducibility when the display device 1 displays the screen by the light emitting area.

The above-described light emitting portions LA_R, LA_G, and LA_B may constitute the light emitting element together with pixel electrodes 141, 142, and 143 (see FIG. 6), which are disposed to overlap the light emitting portions LA_R, LA_G, and LA_B at lower portions in the thickness direction, and a common electrode 160 at an upper portion thereof.

The common electrode 160 may include a material layer with a small work function that may be formed of a material such as Li, Ca, LiF/Ca, LiF/Al, Al, Mg, Ag, Pt, Pd, Ni, Au, Nd, Ir, Cr, BaF, Ba, or a compound or mixture thereof (for example, a mixture of Ag and Mg). The common electrode 160 may include a transparent metal oxide layer disposed on the material layer with a small work function.

A light transmittance of the material layer with a small work function of the common electrode 160 may be lower than light transmittances of the first substrate SUB1 and the second substrate SUB2 and may be lower than light transmittances of inorganic insulating layers which will be described below.

The common electrode 160 according to an embodiment may be patterned such that the common electrode 160 is not disposed throughout the entire surface of the active area AAR, disposed to overlap the pixel area PXA of the active area AAR, and disposed not to overlap the light transmitting area TA. For example, the common electrode 160 may be formed through a photolithography process using a mask such that the common electrode 160 is disposed not to overlap the light transmitting area TA and disposed to overlap the pixel area PXA. In this way, since the common electrode 160 is not disposed in the light transmitting area TA, it may be possible to improve a light transmittance of the display device 1 through the light transmitting area TA.

The display panel 100 may include the first substrate SUB1, the second substrate SUB2, conductive layers, insulating layers to insulate the conductive layers, and an organic layer, and the like.

A buffer layer 102 may be disposed on the first substrate SUB1. The buffer layer 102 may prevent permeation of moisture and oxygen through the first substrate SUB1 from the outside. The buffer layer 102 may planarize a surface of the first substrate SUB1. In an embodiment, the buffer layer 102 may include any one of a silicon nitride (SiNx) film, a silicon oxide (SiO2) film, and a silicon oxynitride (SiOxNy) film.

The buffer layer 102 may not be disposed in an area of the first substrate SUB1 in which the sealing member SEL is disposed. However, the embodiments are not limited thereto. The buffer layer 102 may be disposed to overlap the sealing member SEL. In other embodiments, the buffer layer 102 may be disposed in contact with the sealing member SEL.

A semiconductor layer 110 (see FIG. 16) may be disposed on the buffer layer 102. The semiconductor layer 110 includes semiconductor patterns 111 to 113. A first semiconductor pattern 111 may be disposed in the first light emitting portion LA_R, the second semiconductor pattern 112 may be disposed in the second light emitting portion LA_G, and the third semiconductor pattern 113 may be disposed in the third light emitting portion LA_B. The semiconductor patterns 111 to 113 may constitute channels of thin film transistors of the light emitting portions LA_R, LA_G, and LA_B, respectively. The semiconductor layer 110 may include source and drain areas and an active area. The semiconductor layer 110 may include polycrystalline silicon or oxide semiconductor.

A first insulating layer 103 may be disposed on the semiconductor layer 110. The first insulating layer 103 may be disposed in the active area AAR. The first insulating layer 103 may be a gate insulating film having a gate insulating function. The first insulating layer 103 may include a silicon compound, metal oxide, or the like. For example, the first insulating layer 103 may include silicon oxide, silicon nitride, silicon oxynitride, aluminum oxide, tantalum oxide, hafnium oxide, zirconium, titanium oxide, and the like. These may be used solely or in combination with each other.

A first conductive layer 120 may be disposed on the first insulating layer 103. In an embodiment, the first conductive layer 120 may include a gate electrode 121 of the thin film transistor of the first light emitting portion LA_R, a gate electrode 122 of the thin film transistor of the second light emitting portion LA_G, and a gate electrode 123 of the thin film transistor of the third light emitting portion LA_B. The first conductive layer 120 may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

A second insulating layer 104 may be disposed on the first conductive layer 120. The second insulating layer 104 may insulate the first conductive layer 120 and a second conductive layer 130 from each other. The second insulating layer 104 may include a material selected from the materials listed above with respect to the first insulating layer 103.

The second conductive layer 130 may be disposed on the second insulating layer 104. The second conductive layer 130 may include source electrodes and drain electrodes. The second conductive layer 130 may include a source electrode 131 and a drain electrode 132 of the thin film transistor of the first light emitting portion LA_R, a source electrode 133 and a drain electrode 134 of the thin film transistor of the second light emitting portion LA_G, and a source electrode 135 and a drain electrode 136 of the thin film transistor of the third light emitting portion LA_B.

The second conductive layer 130 may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

A first via layer 151 may be disposed on the second conductive layer 130. The first via layer 151 may include an organic insulating material such as acrylate resin, epoxy resin, phenolic resin, polyamide resin, polyimide resin, unsaturated polyester resin, polyphenylene ether resin, polyphenylene sulfide resin, benzocyclobutene (BCB), or the like.

A third conductive layer 140 may be disposed on the first via layer 151. The third conductive layer 140 may include a first pixel electrode 141 disposed in the first light emitting portion LA_R, a second pixel electrode 142 disposed in the second light emitting portion LA_G, and a third pixel electrode 143 disposed in the third light emitting portion LA_B. The first pixel electrode 141 may be electrically connected to the drain electrode 132 of the thin film transistor of the first light emitting portion LA_R through a contact hole passing through the first via layer 151, the second pixel electrode 142 may be electrically connected to the drain electrode 134 of the thin film transistor of the second light emitting portion LA_G through a contact hole passing through the first via layer 151, and the third pixel electrode 143 may be electrically connected to the drain electrode 136 of the thin film transistor of the third light emitting portion LA_B through a contact hole passing through the first via layer 151.

A bank layer 152 may be disposed on the third conductive layer 140. The bank layer 152 may include an opening through which the pixel electrodes 141 to 143 are exposed. The bank layer 152 may be formed of a black organic insulating material or a black inorganic insulating material. In an embodiment, the bank layer 152 may include an organic insulating material such as a photoresist, polyimide resin, acrylate resin, a silicon compound, and polyacrylate resin and may include a black material in addition to the organic insulating material. The black material may be formed to include at least one of a black pigment, a black dye, and black carbon.

Since the bank layer 152 includes the black material, the display panel 100 according to an embodiment can reduce reflection due to external light incident toward a display surface.

Figure 16:
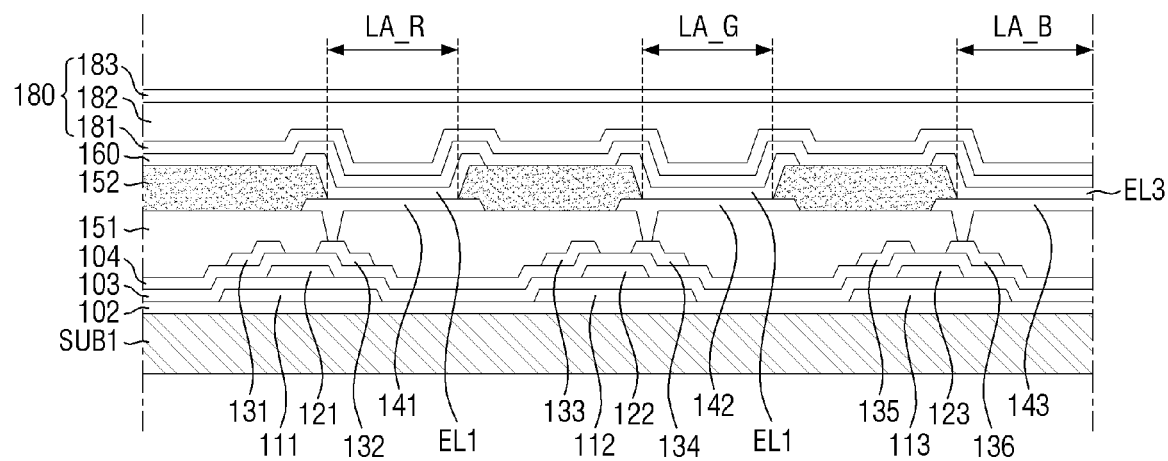
FIG. 16 is a schematic cross-sectional view of the display device according to an embodiment.

Organic layers EL1, EL2, and EL3 may be disposed at an upper surface of the third conductive layer 140 and within the opening of the bank layer 152 as illustrated in FIG. 16. That is, the first organic layer EL1 may be disposed to overlap the first pixel electrode 141, the second organic layer EL2 may be disposed to overlap the second pixel electrode 142, and the third organic layer EL3 may be disposed to overlap the third pixel electrode 143.

As described above, the common electrode 160 may be disposed for each of the light emitting areas LA1, LA2, and LA3 on the organic layers EL1, EL2, and EL3 and the bank layer 152.

The second substrate SUB2 may be disposed at the uppermost portion of the display panel 100. A black matrix BM may be disposed in the non-light emitting areas NLA1, NLA2, and NLA3 of the second substrate SUB2. The black matrix BM may be disposed to overlap the bank layer 152 in the thickness direction.

An adhesive member 170 may be disposed between the second substrate SUB2 and the common electrode 160. The adhesive member 170 may couple the configuration stacked on the first substrate SUB1 and the second substrate SUB2 to each other.

Referring to FIG. 5, as described above, the sealing member SEL may be disposed between the first substrate SUB1 and the second substrate SUB2 in the non-active area NAR of the display device 1.

Referring to FIG. 6, although the above-described inorganic insulating layers 102, 103, and 104 of the display panel 100 are disposed throughout the entire surface of the active area AAR and thus are also disposed in the light transmitting area TA, the above-described organic layers 151 and 152 of the display panel 100 may be disposed in the pixel area PXA but not be disposed in the light transmitting area TA. The bank layer 152 including the black material may be disposed only in the non-light emitting area NLA of the pixel area PXA and not be disposed in the light emitting area LA. The bank layer 152 including the black material may not be disposed in the light transmitting area TA.

Since, as described above, the active area AAR according to an embodiment is formed by grouping a single light transmitting area and two light emitting areas together, a larger number of light emitting areas may be disposed in the pixel area PXA which is limited, and thus it may be possible to implement the display device 1 in high resolution.

Since three light emitting portions emit lights of different colors are disposed in each light emitting area, a separation distance between adjacent light emitting portions which emit lights of the same color may be decreased, and thus it may be possible to achieve high color reproducibility when the display device 1 displays an image on the screen by the light emitting area.

Also, the common electrode 160 according to an embodiment may be patterned such that the common electrode 160 is not disposed throughout the entire surface of the active area AAR, disposed to overlap the pixel area PXA of the active area AAR, and disposed not to overlap the light transmitting area TA. For example, the common electrode 160 may be formed through a photolithography process using a mask such that the common electrode 160 is disposed not to overlap the light transmitting area TA and disposed to overlap the pixel area PXA. In this way, since the common electrode 160 is not disposed in the light transmitting area TA, it may be possible to improve the light transmittance of the display device 1 through the light transmitting area TA.

Hereinafter, a display device according to an embodiment will be described. In the following embodiments, configurations identical to those of the above-described embodiment will be denoted by like reference numerals, and description thereof will be omitted or simplified.

Figure 7:
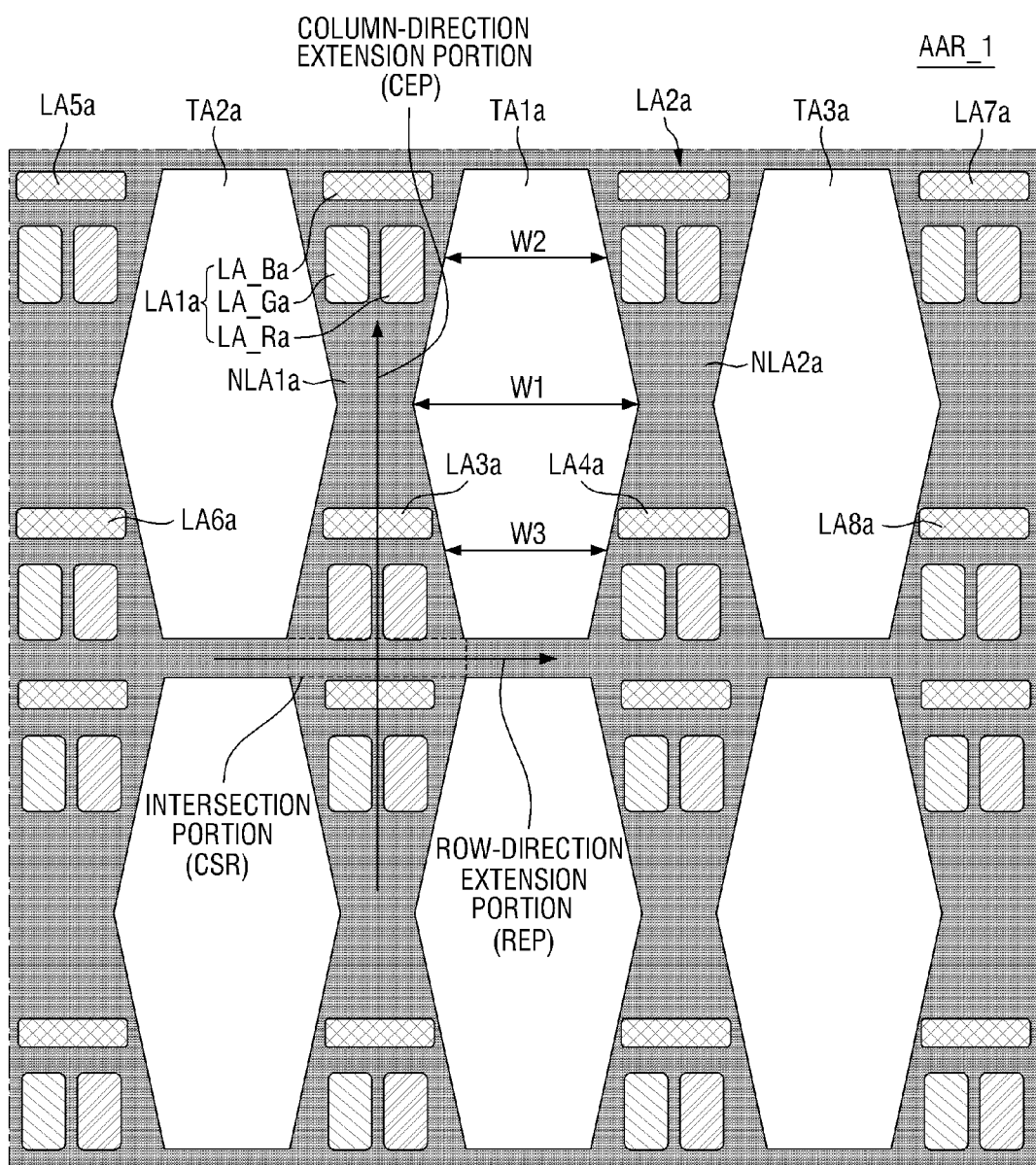
FIG. 7 is a plan arrangement view illustrating an active area of a display panel according to an embodiment.

FIG. 7 is a plan arrangement view illustrating an active area of a display panel according to an embodiment.

Referring to FIG. 7, an active area AAR_1 of the display panel according to the embodiment may be different from the active area AAR of the display panel according to the above-described embodiment in terms of the arrangement of light transmitting areas TAa and the arrangement of light emitting areas LAa.

For example, referring to FIG. 7, the active area AAR_1 of the display panel according to the embodiment may include light transmitting areas TA1a to TA3a and pixel areas disposed between the light transmitting areas TA1a to TA3a. The pixel areas each include a light emitting area from which light is emitted and a non-light emitting area which does not emit light. Light emitting areas may be disposed around the light transmitting areas TA1a to TA3a.

The light transmitting areas TA1a to TA3a may each have a substantially hexagonal shape in the plan view. Regarding the first light transmitting area TA1a, in the first light transmitting area TA1a, a width W1 of a central portion in the first direction DR1 may be larger than a width W2 of one side in the first direction DR1 from an upper portion of the first light transmitting area TA1a and a width W3 of the other side, or lower portion, in the first direction DR1 from the central portion.

The sizes of the light transmitting areas TA1a to TA3a may be substantially the same in the plan view. However, embodiments are not limited thereto, and the light transmitting areas TA1a to TA3a may have different sizes in the plan view.

Regarding the first light transmitting area TA1a, the first light transmitting area TA1a may include a first portion, e.g., a first transmitting side and a second transmitting side which may be disposed at the other side in the first direction DR1, and a second portion, for example, a third transmitting side and a fourth transmitting side which may be disposed at the one side in the first direction DR1. The first transmitting side may be disposed at an upper portion of the second transmitting side at the one side in the second direction DR2, and the third transmitting side may be disposed at an upper portion of the fourth transmitting side at the one side in the second direction DR2. The first transmitting side, the second transmitting side, the third transmitting side, and the fourth transmitting side may be inclined at a predetermined angle. The predetermined angle may be an obtuse angle.

The second light transmitting area TA2a may be disposed adjacent to the first transmitting side and the second transmitting side of the first light transmitting area TA1a, and the third light transmitting area TA3a may be disposed adjacent to the third transmitting side and the fourth transmitting side of the first light transmitting area TA1a.

A pixel area may surround each of the light transmitting areas TA1a to TA3a. The pixel area may extend along a row-direction extension portion REP and a column-direction extension portion CEP of the active area AAR_1 according to the embodiment. The pixel area may include a first pixel area disposed between the first light transmitting area TA1a and the second light transmitting area TA2a and a second pixel area disposed between the first light transmitting area TA1a and the third light transmitting area TA3a. The first pixel area and the second pixel area may extend along the column-direction extension portion CEP.

Along the shapes of the light transmitting areas TA1a to TA13 adjacent thereto in the plan view, the first pixel area and the second pixel area may have a shape in which a width gradually decreases toward a central portion and gradually increases toward the one side and the other side in the second direction DR2 from the central portion in the plan view.

The first pixel area may include a first light emitting area LA1a, a third light emitting area LA3a, and a first non-light emitting area NLA1a surrounding the first light emitting area LA1a and the third light emitting area LA3a, and the second pixel area may include a second light emitting area LA2a, a fourth light emitting area LA4a, and a second non-light emitting area NLA2a surrounding the second light emitting area LA2a and the fourth light emitting area LA4a. The second light emitting area LA2a may be disposed at the other side in the first direction DR1 from the first light emitting area LA1a, and the fourth light emitting area LA4a may be disposed at the other side in the first direction DR1 from the second light emitting area LA2a.

In the display device according to the embodiment, a light emitting area may not be disposed at an intersection portion CSR where the row-direction extension portion REP and the column-direction extension portion CEP intersect each other.

The light emitting areas LA1a to LA4a may each include a first light emitting portion LA_Ra to emit light of a first color, a second light emitting portion LA_Ga to emit light of a second color, and a third light emitting portion LA_Ba to emit light of a third color.

The first light emitting area LA1a, the third light emitting area LA3a, a fifth light emitting area LA5a, a sixth light emitting area LA6a may be disposed around the second light transmitting area TA2a. The fifth light emitting area LA5a and the sixth light emitting area LA6a may be disposed at a first portion of the second light transmitting area TA2a, and the first light emitting area LA1a and the third light emitting area LA3a may be disposed at a second portion of the second light transmitting area TA2a that is disposed at the other side in the first direction DR1 from the first portion.

The second light emitting area LA2a, the fourth light emitting area LA4a, a seventh light emitting area LA7a, and an eighth light emitting area LA8a may be disposed around the third light transmitting area TA3a. The second light emitting area LA2a and the fourth light emitting area LA4a may be disposed at a first portion of the third light transmitting area TA3a, and the seventh light emitting area LA7a and the eighth light emitting area LA8a may be disposed at a second portion of the third light transmitting area TA3a that is disposed at the other side in the first direction DR1 from the first portion.

The fifth light emitting area LA5a may correspond to the first light emitting area LA1a, the sixth light emitting area LA6a may correspond to the third light emitting area LA3a, the seventh light emitting area LA7a may correspond to the second light emitting area LA2a, and the eighth light emitting area LA8a may correspond to the fourth light emitting area LA4a.

Hereinafter, the light emitting portions will be described based on the first light emitting area LA1a.

Each of the light emitting portions LA_Ra, LA_Ga, and LA_Ba may have a substantially rectangular shape in the plan view. However, embodiments are not limited thereto, and it will be apparent that each of the light emitting portions LA_Ra, LA_Ga, and LA_Ba may also have other polygonal shapes or other shapes such as a substantially circular shape and a substantially elliptical shape in the plan view.

When each of the light emitting portions LA_Ra, LA_Ga, and LA_Ba has a substantially rectangular shape in the plan view, the light emitting portions LA_Ra, LA_Ga, and LA_Ba may extend such that an extending direction of any one light emitting portion may be different from an extending direction of the remaining light emitting portions, and thus separation distances therebetween may be decreased. In this way, the total area of the light emitting areas in which the three light emitting portions are disposed may be reduced, and a larger number of light emitting areas may be disposed in the pixel area.

For example, as illustrated in FIG. 7, the third light emitting portion LA_Ba may have a shape extending in the first direction DR1, and the first and second light emitting portions LA_Ra and LA_Ga may each have a shape extending in the second direction DR2.

The sizes of the light emitting portions LA_Ra, LA_Ga, and LA_Ba may be substantially the same in the plan view. However, embodiments are not limited thereto, and the sizes of the light emitting portions LA_Ra, LA_Ga, and LA_Ba in the plan view may be different from each other, or the sizes of any two may be substantially the same while the size of the remaining one may be different in the plan view.

The third light emitting portion LA_Ba may be disposed at the one side in the second direction DR2 from the first and second light emitting portions LA_Ra and LA_Ga. However, embodiments are not limited thereto, and third light emitting portion LA_Ba may also be disposed at the other side in the second direction DR2 from the first and second light emitting portions LA_Ra and LA_Ga, or the arrangement method thereof may be combined in various ways.

The active area AAR_1 may be formed by grouping a single light transmitting area and two light emitting areas together. For example, the first light transmitting area TA1a may be grouped with the first light emitting area LA1a and the second light emitting area LA2a. However, embodiments are not limited thereto, and the first light transmitting area TA1a may be grouped with the first light emitting area LA1a and the third light emitting area LA3a, grouped with the second light emitting area LA2a and the fourth light emitting area LA4a, or grouped with the third light emitting area LA3a and the fourth light emitting area LA4a.

Since the active area AAR_1 according to the embodiment is formed by grouping a single light transmitting area and two light emitting areas together, a larger number of light emitting areas may be disposed in the pixel area PXA which is limited, and thus it may be possible to implement the display device 1 in high resolution.

Also, since three light emitting portions emit lights of different colors are disposed in each light emitting area, a separation distance between adjacent light emitting portions which emit lights of the same color may be decreased, and thus it may be possible to achieve high color reproducibility when the display device 1 displays an image on the screen by the light emitting area.

Figure 8:
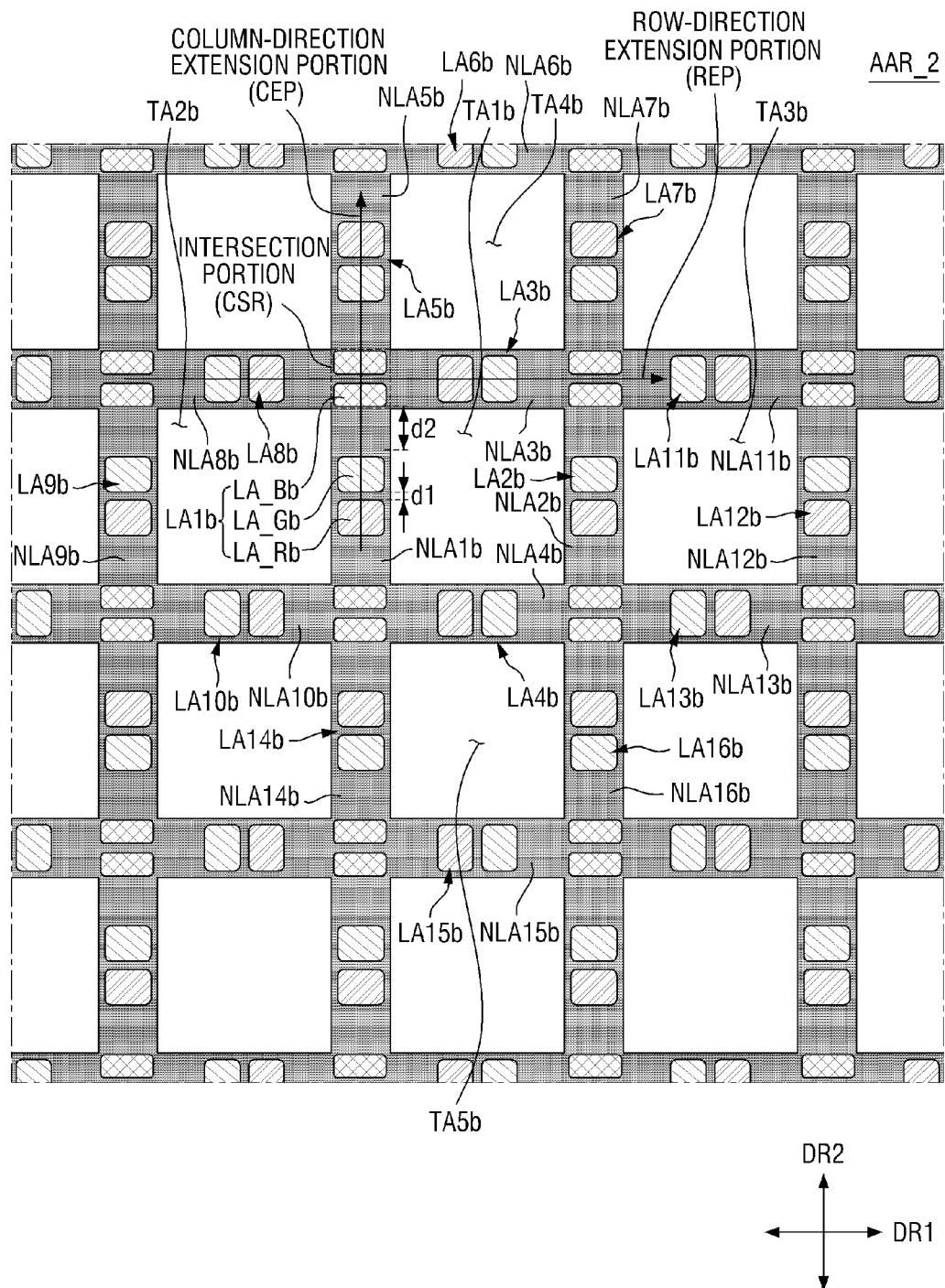
FIG. 8 is a plan arrangement view illustrating an active area of a display panel according to an embodiment.

FIG. 8 is a plan arrangement view illustrating an active area of a display panel according to an embodiment.

Referring to FIG. 8, an active area AAR_2 of the display panel according to the embodiment may differ from the active area AAR of the display panel according to the above-described embodiment in terms of the arrangement of light transmitting areas TAb and the arrangement of light emitting areas LAb.

For example, referring to FIG. 8, the active area AAR_2 of the display panel according to the embodiment may include light transmitting areas TA1b to TA5b and pixel areas disposed between the light transmitting areas TA1b to TA5b. The pixel areas each include a light emitting area from which light is emitted and a non-light emitting area which does not emit light.

The light transmitting areas TA1b to TA5b may each have a substantially square shape in the plan view. However, embodiments are not limited thereto, and each of the light transmitting areas TA1b to TA5b may also have a substantially rectangular shape in the plan view.

Regarding the first light transmitting area TA1b, the first light transmitting area TA1b includes four sides. The sizes of the light transmitting areas TA1b to TA5b may be substantially the same in the plan view. However, embodiments are not limited thereto, and the light transmitting areas TA1b to TA5b may have different sizes in the plan view.

Regarding the first light transmitting area TA1b, the first light transmitting area TA1b may include a first portion, for example, a first transmitting side disposed at the other side in the first direction DR1, a second portion, for example, a second transmitting side disposed at the one side in the first direction DR1, a third portion, for example, a third transmitting side disposed at the one side in the second direction DR2, and a fourth portion, for example, a fourth transmitting side disposed at the other side in the second direction DR2.

The second light transmitting area TA2b may be disposed adjacent to the first transmitting side of the first light transmitting area TA1b, the third light transmitting area TA3b may be disposed adjacent to the second transmitting side of the first light transmitting area TA1b, the fourth light transmitting area TA4b may be disposed adjacent to the third transmitting side of the first light transmitting area TA1b, and the fifth light transmitting area TA5b may be disposed adjacent to the fourth transmitting side of the first light transmitting area TA1b.

A pixel area may surround each of the light transmitting areas TA1b to TA5b. The pixel area may extend along a row-direction extension portion REP and a column-direction extension portion CEP of the active area AAR_2 according to the embodiment. The pixel area may include a first pixel area disposed between the first light transmitting area TA1b and the second light transmitting area TA2b, a second pixel area disposed between the first light transmitting area TA1b and the third light transmitting area TA3b, a third pixel area disposed between the first light transmitting area TA1b and the fourth light transmitting area TA4b, and a fourth pixel area disposed between the first light transmitting area TA1b and the fifth light transmitting area TA5b.

The first pixel area and the second pixel area may extend in the second direction DR2, and the third pixel area and the fourth pixel area may extend in the first direction DR1.

The first pixel area may include a first light emitting area LA1b and a first non-light emitting area NLA1b disposed around the first light emitting area LA1b, the second pixel area may include a second light emitting area LA2b and a second non-light emitting area NLA2b disposed around the second light emitting area LA2b, the third pixel area may include a third light emitting area LA3b and a third non-light emitting area NLA3b disposed around the third light emitting area LA3b, and the fourth pixel area may include a fourth light emitting area LA4b and a fourth non-light emitting area NLA4b disposed around the fourth light emitting area LA4b.

The light emitting areas LA1b to LA4b may each include a first light emitting portion LA_Rb to emit light of a first color, a second light emitting portion LA_Gb to emit light of a second color, and a third light emitting portion LA_Bb to emit light of a third color.

The first light emitting area LA1b and an eighth light emitting area LA8b to a tenth light emitting area LA10b may be disposed around the second light transmitting area TA2b, the second light emitting area LA2b and an eleventh light emitting area LA11b to a thirteenth light emitting area LA13b may be disposed around the third light transmitting area TA3b, the third light emitting area LA3b and a fifth light emitting area LA5b to a seventh light emitting area LA7b may be disposed around the fourth light transmitting area TA4b, and the fourth light emitting area LA4b and a fourteenth light emitting area LA14b to a sixteenth light emitting area LA16b may be disposed around the fifth light transmitting area TA5b.

The ninth light emitting area LA9b of the second light transmitting area TA2b, the fifth light emitting area LA5b of the fourth light transmitting area TA4b, the second light emitting area LA2b of the third light transmitting area TA3b, and the fourteenth light emitting area LA14b of the fifth light transmitting area TA5b may correspond to the first light emitting area LA1b of the first light transmitting area TA1b. The eighth light emitting area LA8b of the second light transmitting area TA2b, the sixth light emitting area LA6b of the fourth light transmitting area TA4b, the eleventh light emitting area LA11b of the third light transmitting area TA3b, and the fourth light emitting area LA4b of the fifth light transmitting area TA5b may correspond to the third light emitting area LA3b of the first light transmitting area TA1b. The tenth light emitting area LA10b of the second light transmitting area TA2b, the third light emitting area LA3b of the fourth light transmitting area TA4b, the thirteenth light emitting area LA13b of the third light transmitting area TA3b, and the fifteenth light emitting area LA15b of the fifth light transmitting area TA5b may correspond to the fourth light emitting area LA4b of the first light transmitting area TA1b. The first light emitting area LA1b of the second light transmitting area TA2b, the seventh light emitting area LA7b of the fourth light transmitting area TA4b, the twelfth light emitting area LA12b of the third light transmitting area TA3b, and the sixteenth light emitting area LA16b of the fifth light transmitting area TA5b may correspond to the second light emitting area LA2b of the first light transmitting area TA1b.

Hereinafter, the light emitting portions will be described based on the first light emitting area LA1b.

Each of the light emitting portions LA_Rb, LA_Gb, and LA_Bb may have a substantially rectangular shape in the plan view. However, embodiments are not limited thereto, and it will be apparent that each of the light emitting portions LA_Rb, LA_Gb, and LA_Bb may also have other polygonal shapes or other shapes such as a substantially circular shape and a substantially elliptical shape in the plan view.

The light emitting portions LA_Rb, LA_Gb, and LA_Bb according to the embodiment may be disposed at about or approximate to the central portion of the first light transmitting area TA1b or at an intersection portion CSR. As illustrated in FIG. 8, the first and second light emitting portions LA_Rb and LA_Gb may be disposed at about or approximate to a central portion of the first transmitting side of the first light transmitting area TA1b, and the third light emitting portion LA_Bb may be disposed at or approximate to a corner portion of the first light transmitting area TA1b. The first and second light emitting portions LA_Rb and LA_Gb may be disposed to be spaced apart from each other by a first separation distance d1, and the second and third light emitting portions LA_Gb and LA_Bb may be disposed to be spaced apart from each other by a second separation distance d2. According to the embodiment, the first separation distance d1 may be substantially smaller than the second separation distance d2. The third light emitting portion LA_Bb may be disposed to face a third light emitting portion of another light emitting area adjacent thereto.

The active area AAR_2 may be formed by grouping a single light transmitting area and two light emitting areas together. For example, the first light transmitting area TA1b may be grouped with the first light emitting area LA1b and the second light emitting area LA2b. However, embodiments are not limited thereto, and the first light transmitting area TA1b may be grouped with the first light emitting area LA1b and the third light emitting area LA3b, grouped with the second light emitting area LA2b and the fourth light emitting area LA4b, or grouped with the third light emitting area LA3b and the fourth light emitting area LA4b.

Since the active area AAR_2 according to the embodiment may be formed by grouping a single light transmitting area and two light emitting areas together, a larger number of light emitting areas may be disposed in the pixel area PXA which is limited, and thus it may be possible to implement the display device 1 in high resolution.

Figure 9:
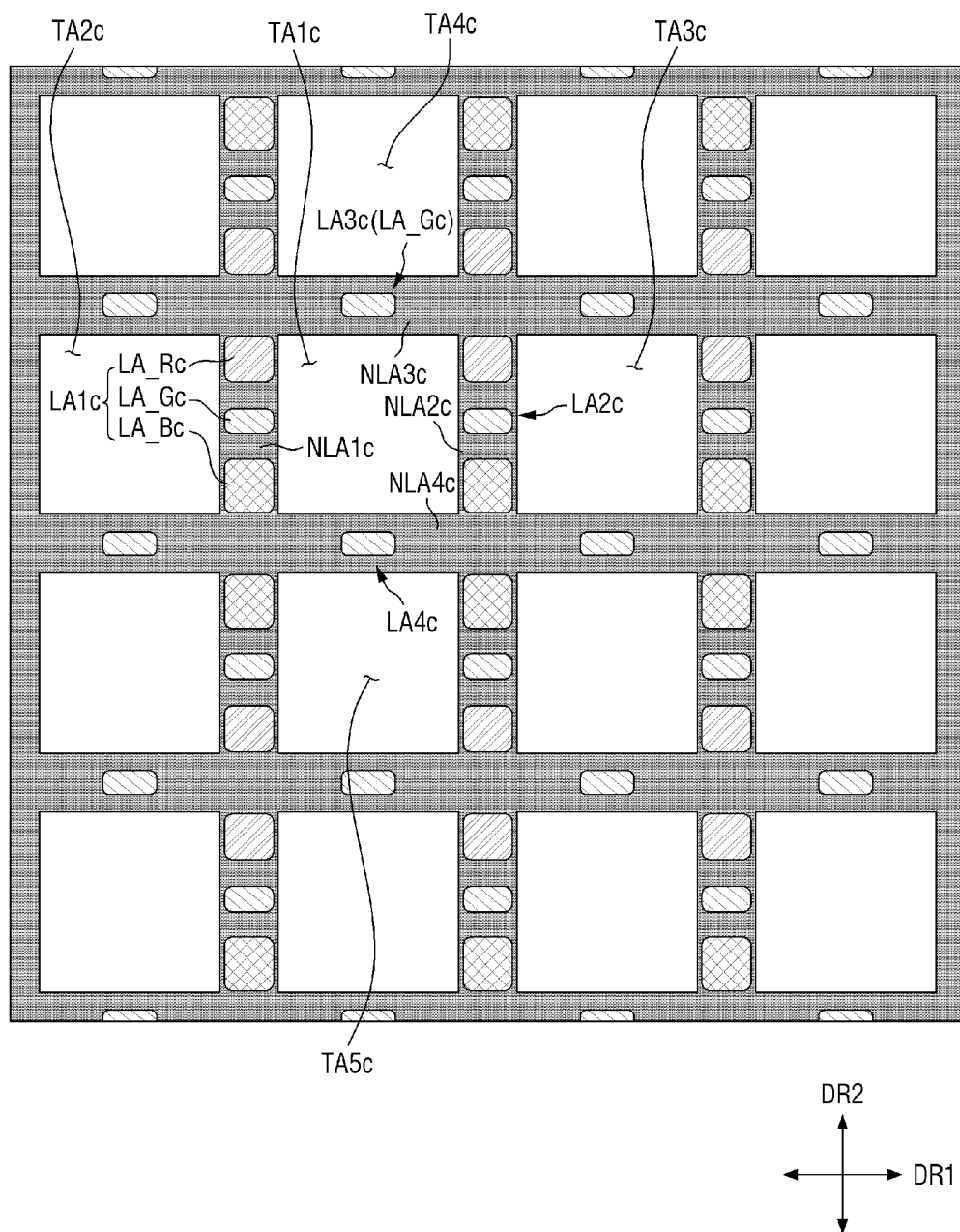
FIG. 9 is a plan arrangement view illustrating an active area of a display panel according to an embodiment.

FIG. 9 is a plan arrangement view illustrating an active area of a display panel according to an embodiment.

Referring to FIG. 9, in an active area AAR_3 of the display panel according to the embodiment, first to third light emitting portions LA_Rc, LA_Gc, and LA_Bc may be disposed at a first transmitting side of a first light transmitting area TA1c, and a second light emitting portion LA_Gc may be disposed at a third transmitting side of the first light transmitting area TA1c.

For example, referring to FIG. 9, the active area AAR_3 of the display panel according to the embodiment may include light transmitting areas TA1c to TA5c and pixel areas disposed between the light transmitting areas TA1c to TA5c. The pixel areas each include a light emitting area from which light is emitted and a non-light emitting area which does not emit light.

The light transmitting areas TA1c to TA5c may each have a substantially square shape in the plan view. However, embodiments are not limited thereto, and each of the light transmitting areas TA1c to TA5c may also have a substantially rectangular shape in the plan view.

Regarding the first light transmitting area TA1c, the first light transmitting area TA1c includes four sides. The sizes of the light transmitting areas TA1c to TA5c may be substantially the same in the plan view. However, embodiments are not limited thereto, and the light transmitting areas TA1c to TA5c may have different sizes in the plan view.

Regarding the first light transmitting area TA1c, the first light transmitting area TA1c may include a first portion, for example, a first transmitting side disposed at the other side in the first direction DR1, a second portion, for example, a second transmitting side disposed at the one side in the first direction DR1, a third portion, for example, a third transmitting side disposed at the one side in the second direction DR2, and a fourth portion, for example, a fourth transmitting side disposed at the other side in the second direction DR2.

The second light transmitting area TA2c may be disposed adjacent to the first transmitting side of the first light transmitting area TA1c, the third light transmitting area TA3c may be disposed adjacent to the second transmitting side of the first light transmitting area TA1c, the fourth light transmitting area TA4c may be disposed adjacent to the third transmitting side of the first light transmitting area TA1c, and the fifth light transmitting area TA5c may be disposed adjacent to the fourth transmitting side of the first light transmitting area TA1c.

A pixel area may surround each of the light transmitting areas TA1c to TA5c. The pixel area may extend along a row-direction extension portion REP and a column-direction extension portion CEP of the active area AAR_3 according to the embodiment. The pixel area may include a first pixel area disposed between the first light transmitting area TA1c and the second light transmitting area TA2c, a second pixel area disposed between the first light transmitting area TA1c and the third light transmitting area TA3c, a third pixel area disposed between the first light transmitting area TA1c and the fourth light transmitting area TA4c, and a fourth pixel area disposed between the first light transmitting area TA1c and the fifth light transmitting area TA5c.

The first pixel area and the second pixel area may extend in the second direction DR2, and the third pixel area and the fourth pixel area may extend in the first direction DR1.

The first pixel area may include a first light emitting area LA1c and a first non-light emitting area NLA1c disposed around the first light emitting area LA1c, the second pixel area may include a second light emitting area LA2c and a second non-light emitting area NLA2c disposed around the second light emitting area LA2c, the third pixel area may include a third light emitting area LA3c and a third non-light emitting area NLA3c disposed around the third light emitting area LA3c, and the fourth pixel area may include a fourth light emitting area LA4c and a fourth non-light emitting area NLA4c disposed around the fourth light emitting area LA4c.

The light emitting areas LA1c to LA4c may each include at least one of a first light emitting portion LA_Rc to emit light of a first color, a second light emitting portion LA_Gc to emit light of a second color, and a third light emitting portion LA_Bc to emit light of a third color. Hereinafter, the light emitting portions will be described based on the first light emitting area LA1c.

Each of the light emitting portions LA_Rc, LA_Gc, and LA_Bc may have a substantially rectangular shape in the plan view. However, embodiments are not limited thereto, and it will be apparent that each of the light emitting portions LA_Rc, LA_Gc, and LA_Bc may also have other polygonal shapes or other shapes such as a substantially circular shape and a substantially elliptical shape in the plan view.

According to the embodiment, the first light emitting area LA1c may include the first to third light emitting portions LA_Rc, LA_Gc, and LA_Bc, and the third light emitting area LA3c may include the second light emitting portion LA_Gc.

Figure 10:
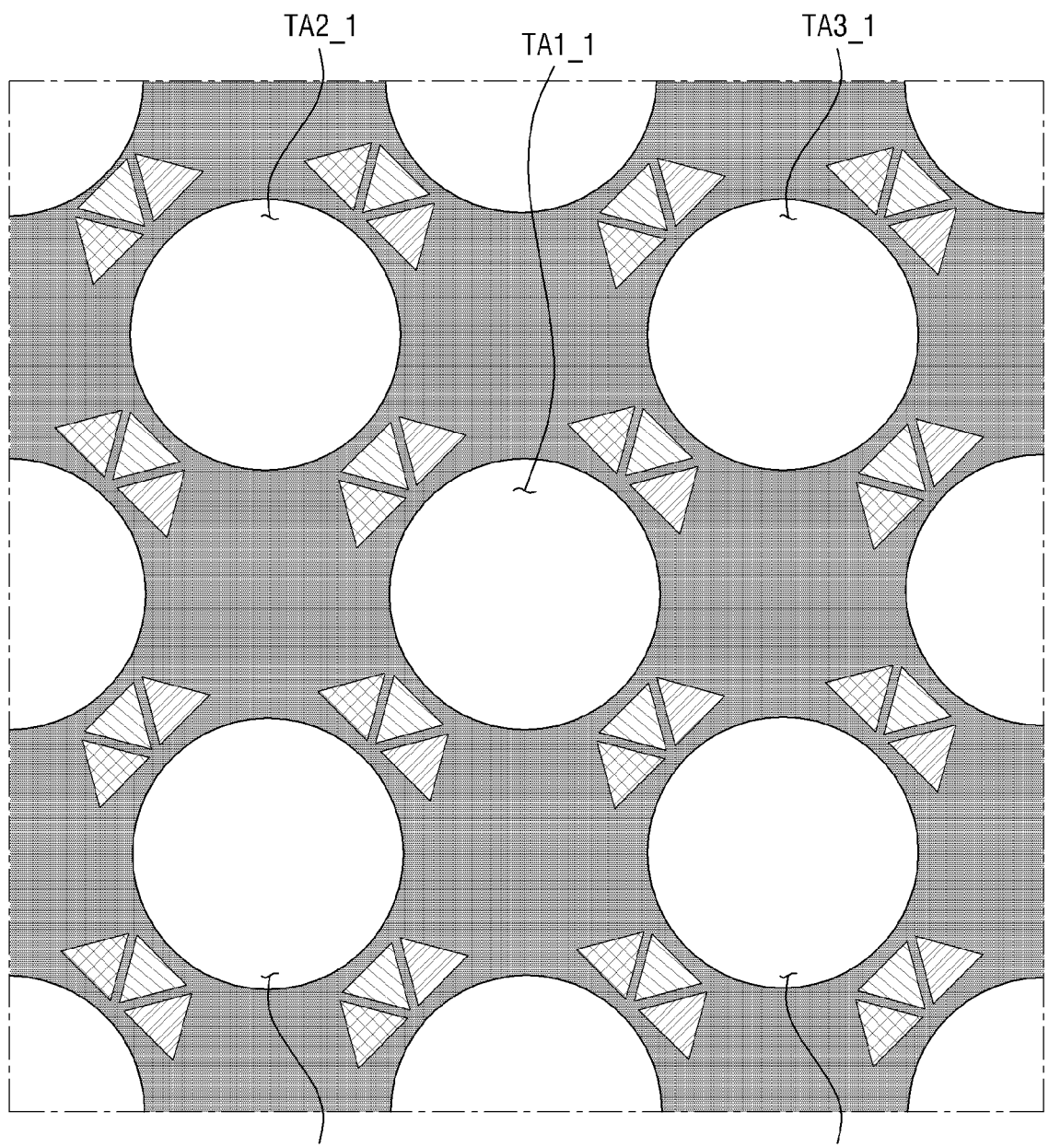
FIG. 10 is a plan arrangement view illustrating an active area of a display panel according to an embodiment.
Figure 11:
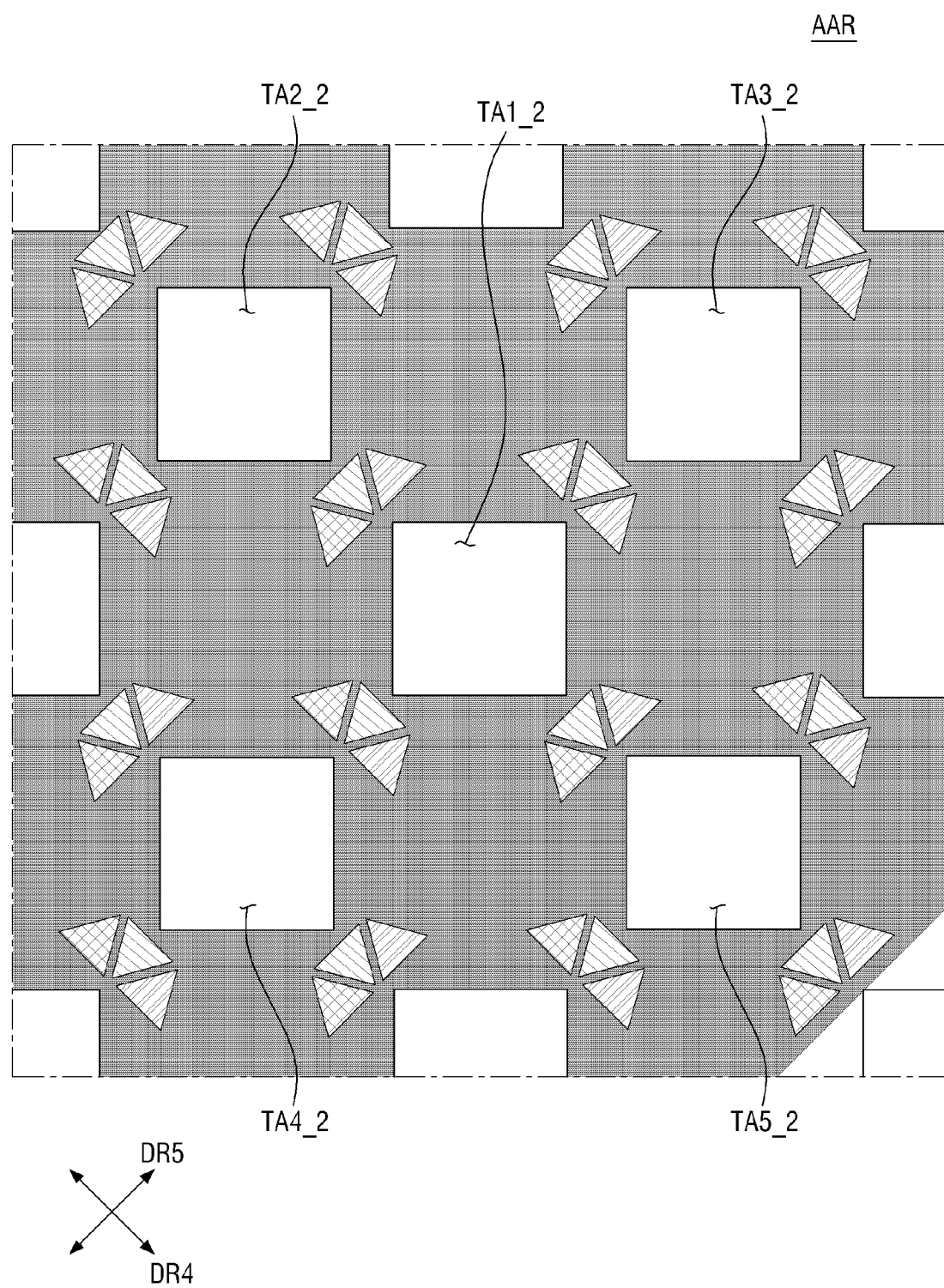
FIG. 11 is a plan arrangement view illustrating an active area of a display panel according to an embodiment.
Figure 12:
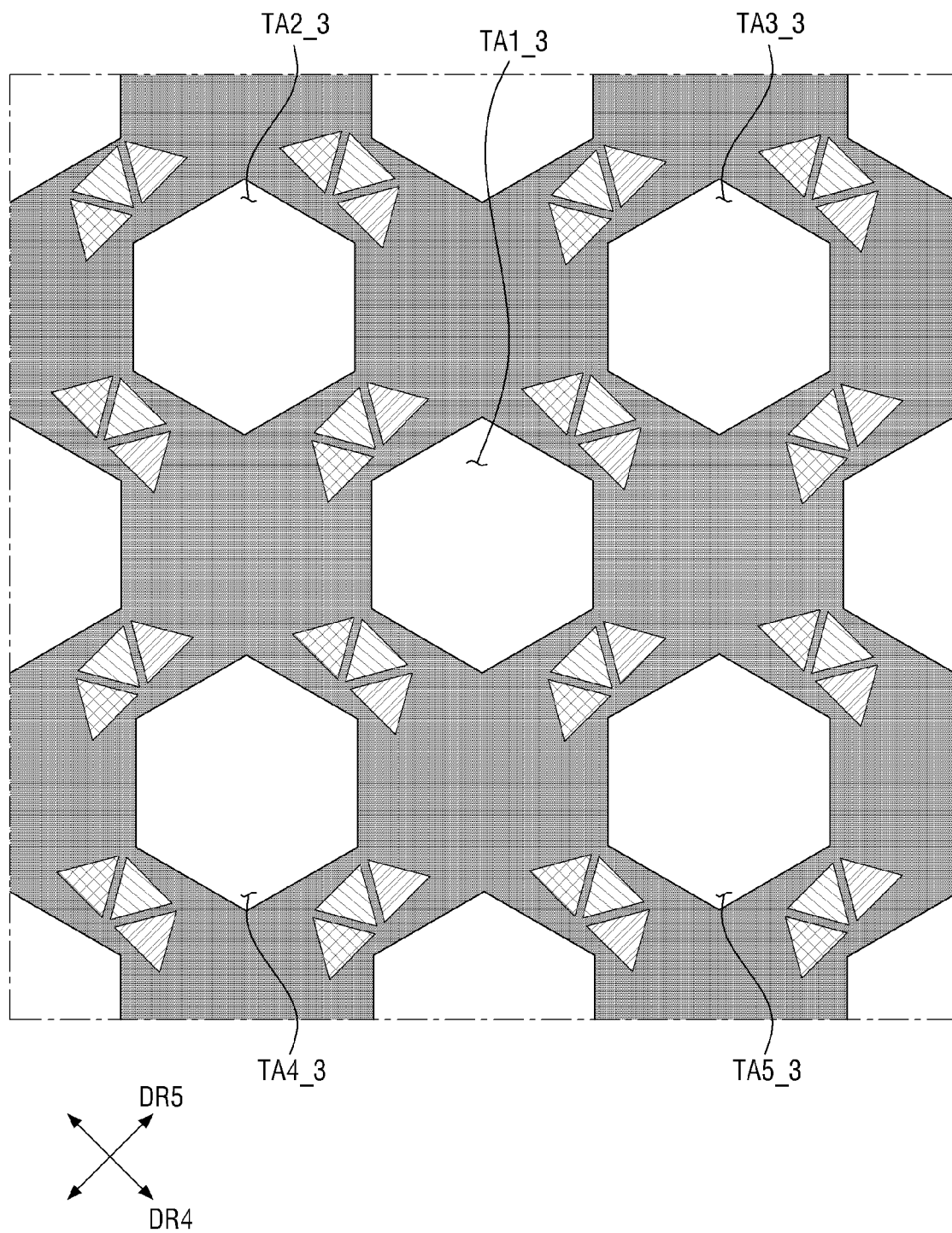
FIG. 12 is a plan arrangement view illustrating an active area of a display panel according to an embodiment.

FIG. 10 is a plan arrangement view illustrating an active area of a display panel according to an embodiment, FIG. 11 is a plan arrangement view illustrating an active area of a display panel according to an embodiment, and FIG. 12 is a plan arrangement view illustrating an active area of a display panel according to an embodiment.

Referring to FIGS. 10 to 12, first light transmitting areas TA1_1, TA1_2 and TA1_3 according to the embodiments may differ from the first light transmitting area TA1 according to FIG. 4 in that the shapes of the first light transmitting areas TA1_1, TA1_2 and TA1_3 in the plan view may be changed in various ways.

For example, referring to FIG. 10, the first light transmitting area TA1_1 may have a substantially circular shape in the plan view; referring to FIG. 11, the first light transmitting area TA1_2 may have a substantially quadrangular shape in the plan view; and referring to FIG. 12, the first light transmitting area TA1_3 may have a substantially hexagonal shape in the plan view.

It is to be understood, that the shapes of the light transmitting areas may be any other shape, or combination of different shapes, within the spirit and scope of the disclosure. For example, the embodiment of FIGS. 4 and 7 through 12 may include light transmitting areas that include combinations of the shapes illustrated therein to achieve light transmittance and high resolution. In other words, the embodiments of FIGS. 4 and 7 through 12 may be combined with each other and are thus not limited to that which is illustrated in those figures. Additionally, the dimensions and sizes of the light transmitting areas and light emitting areas are not limited to that which is illustrated.

Figure 13:
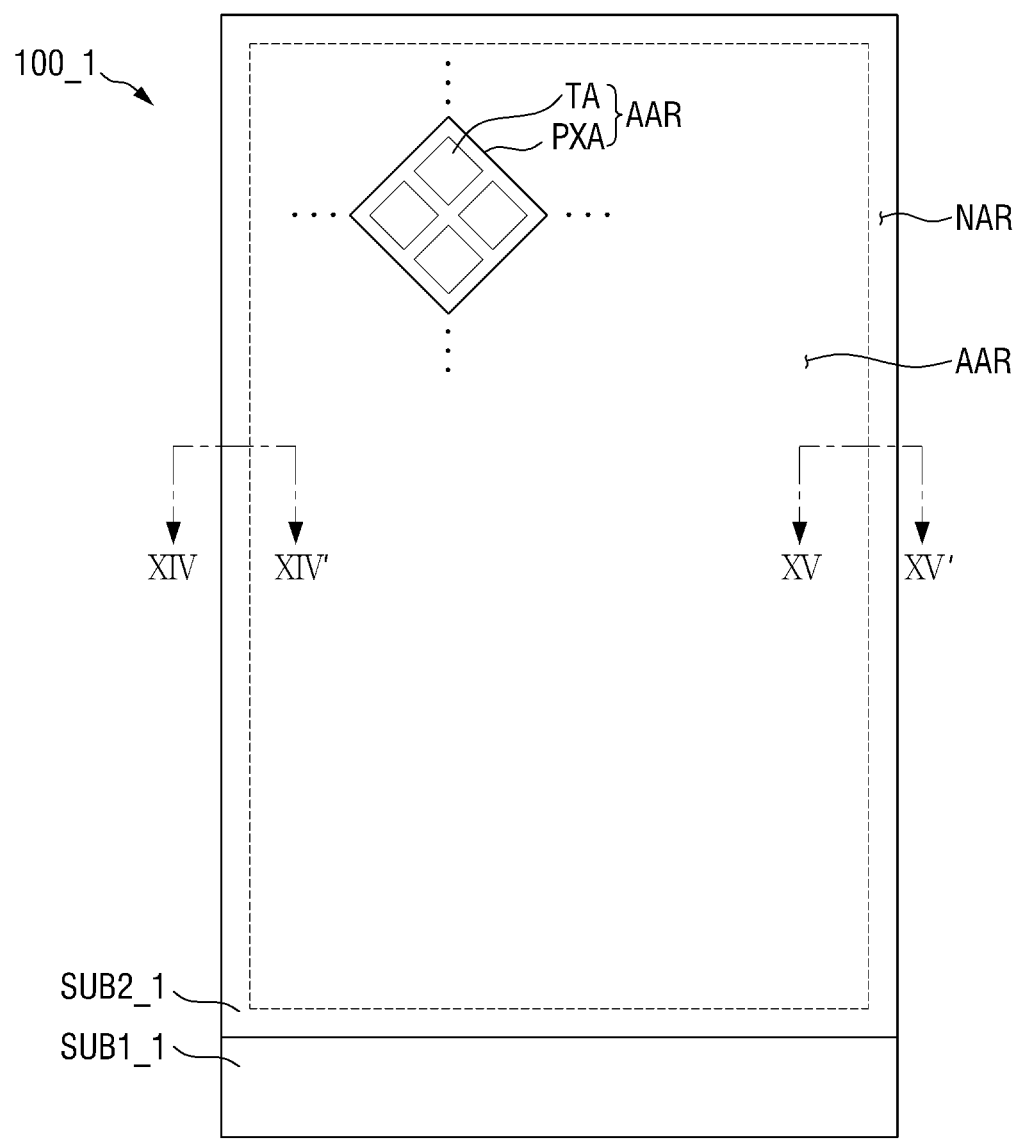
FIG. 13 is a plan view illustrating a display panel of a display device according to an embodiment.
Figure 13:
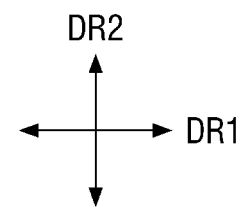
Figure 14:
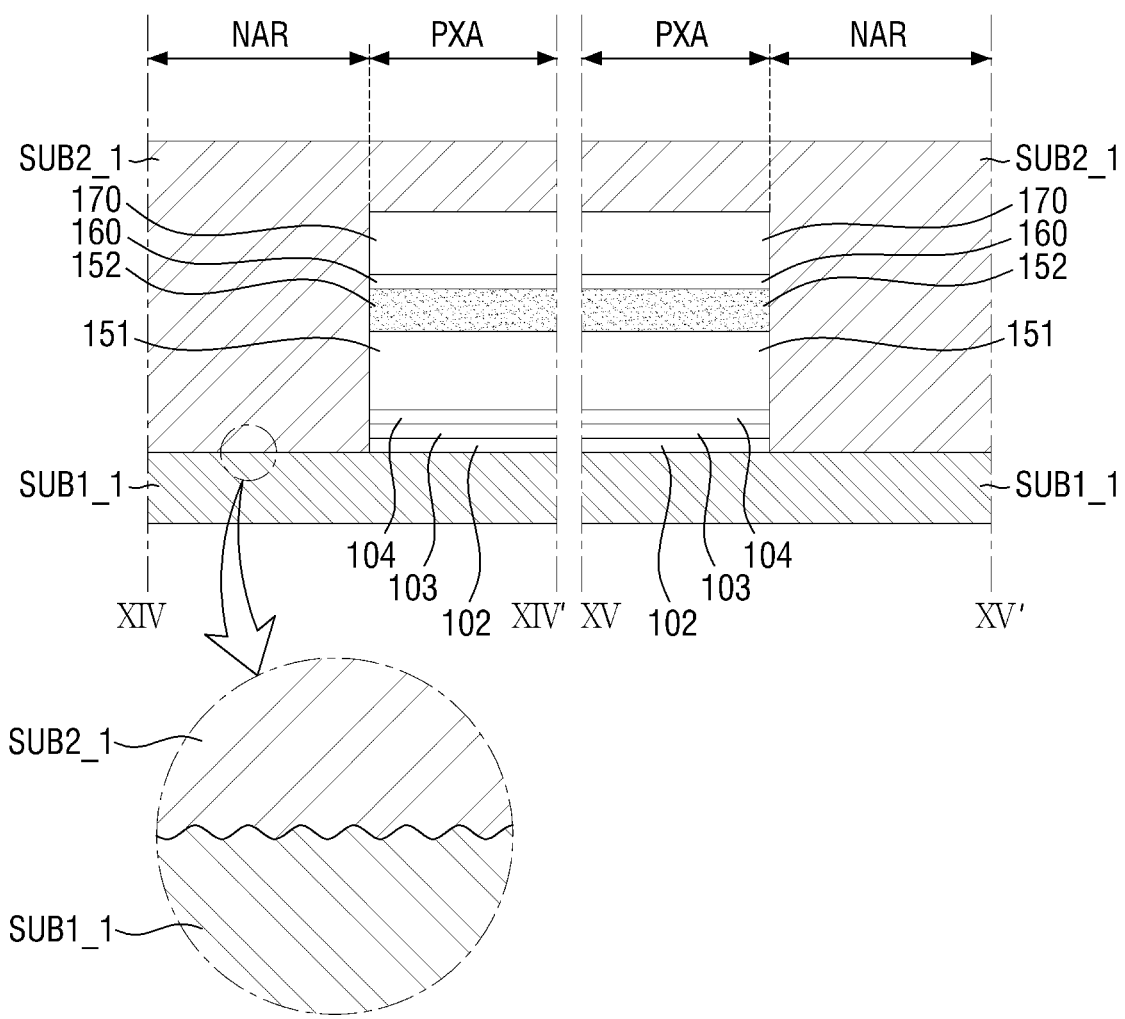
FIG. 14 is a schematic cross-sectional view taken along line XIV-XIV' and line XV-XV' of FIG. 13.

FIG. 13 is a plan view illustrating a display panel of a display device according to an embodiment, and FIG. 14 is a schematic cross-sectional view taken along lines XIV-XIV' and XV-XV' of FIG. 13.

Referring to FIGS. 13 and 14, a display panel 100_1 according to the embodiment may differ from the display panel 100 according to the above-described embodiment.

For example, in the display panel 100_1 according to the embodiment, the first substrate SUB1_1 and the second substrate SUB2_1 may be directly coupled to each other without a sealing member. The first substrate SUB1_1 and the second substrate SUB2_1 may be directly coupled or bonded to each other without interposing an arbitrary configuration or layer therebetween. For example, when a laser sealing device irradiates a non-active area NAR between the first substrate SUB1_1 and the second substrate SUB2_1 with a laser, an interface between the first substrate SUB1_1 and the second substrate SUB2_1 melts and solidifies such that the first substrate SUB1_1 and the second substrate SUB2_1 in the corresponding area may be bonded to each other. In this case, the laser may be a femtosecond (fs) laser, but embodiments are not limited thereto.

Since the first substrate SUB1_1 and the second substrate SUB2_1 are directly coupled to each other without a sealing member, the display panel 100_1 according to the embodiment may improve a light transmittance in the non-active area NAR.

Figure 15:
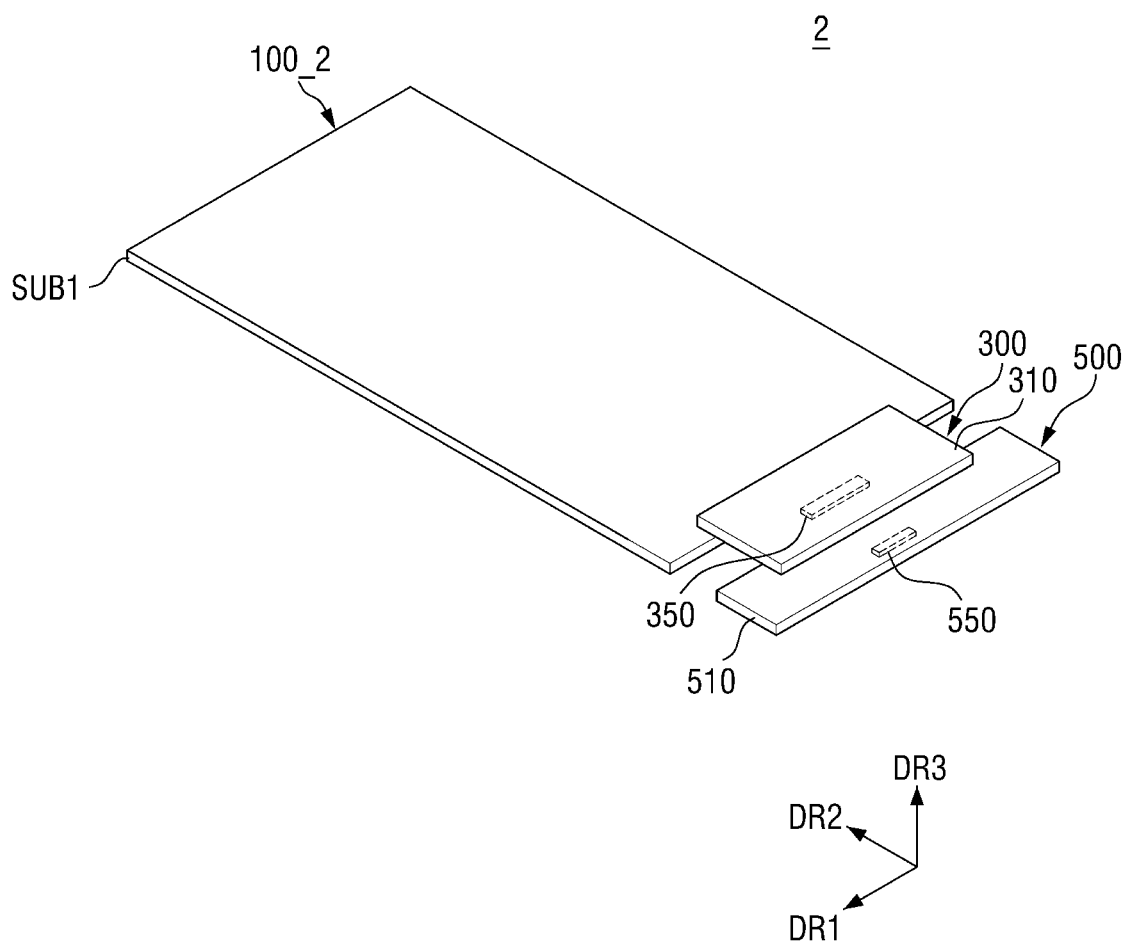
FIG. 15 is a perspective view of a display device according to an embodiment.

FIG. 15 is a perspective view of a display device according to an embodiment, and FIG. 16 is a schematic cross-sectional view of the display device according to an embodiment.

Referring to FIGS. 15 and 16, a display device 2 according to the embodiment may differ from the display device 1.

For example, in the display device 2 according to the embodiment, the display panel 100_2 may not include the second substrate SUB2 and may include a thin film encapsulation layer 180.

The thin film encapsulation layer 180 may include a first inorganic encapsulation film 181, an organic encapsulation film 182 disposed on the first inorganic encapsulation film 181, and a second inorganic encapsulation film 183 disposed on the organic encapsulation film 182.

The thin film encapsulation layer 180 may be disposed on a common electrode 160. The first inorganic encapsulation film 181 of the thin film encapsulation layer 180 may be directly disposed on an upper surface of the common electrode 160.

Since the display panel 100_2 according to the embodiment does not include the second substrate SUB2 and includes the thin film encapsulation layer 180 to encapsulate an upper portion of the common electrode 160, for example, an organic light emitting element, it may be possible to improve a light transmittance of the display device 2.

According to the display device according to an embodiment, high resolution can be realized. Therefore, when light emitting portions do not emit light, a user can view a background of the display device through a light transmitting area whose size is maximized, and, when the light emitting portions emit light, the user can view a display screen whose resolution is further increased.

The advantageous effects according to the embodiments are not limited to those mentioned above, and various other advantageous effects are incorporated herein.

The disclosure has been described above based on the embodiments of the disclosure. However, the embodiments are merely examples and do not limit the disclosure. One of ordinary skill in the art to which the disclosure pertains should understand that various modifications and applications not described herein are possible within the spirit and scope of the disclosure not departing from essential characteristics of the embodiments. For example, each element described in detail in the embodiments of the disclosure may be embodied in a modified form. Also, differences relating to such modifications and applications should be interpreted as falling within the spirit and scope of the disclosure defined by the attached claims.

What is claimed is:
1. A display device comprising:
a plurality of light transmitting areas including a first light transmitting area; and
a plurality of light emitting areas disposed around the light transmitting areas and including a first light emitting area disposed around the first light transmitting area,
wherein the first light emitting area includes:
a first-first light emitting area and a first-second light emitting area which are disposed adjacent to a first portion of the first light transmitting area; and
a first-third light emitting area and a first-fourth light emitting area which are disposed adjacent to a second portion of the first light transmitting area that is disposed at an opposite side of the first portion with the first light transmitting area disposed therebetween, and
the first-first to first-fourth light emitting areas each include:
a first light emitting portion that emits light of a first color;
a second light emitting portion that emits light of a second color; and a third light emitting portion that emits light of a third color.

2. The display device of claim 1, wherein
the first light emitting portion and the second light emitting portion of each light emitting area are disposed in a first direction, and
the third light emitting portion is disposed in a second direction intersecting with the first direction.

3. The display device of claim 2, wherein a width of the first light transmitting area in the first direction gradually increases toward a central portion.

4. The display device of claim 3, wherein the first-first to first-fourth light emitting areas are not disposed around the central portion of the first light transmitting area.

5. The display device of claim 1, further comprising:
a display substrate;
an encapsulation substrate disposed opposite to the display substrate; and
a light emitting element disposed between the display substrate and the encapsulation substrate and disposed in each light emitting area,
wherein the light emitting element includes:
a pixel electrode disposed in each light emitting area;
a common electrode disposed opposite to an anode electrode; and
an organic light emitting layer disposed between the pixel electrode and the common electrode.

6. The display device of claim 5, further comprising a bank layer which partially covers the pixel electrode and includes a black organic film, wherein the bank layer is not disposed in the plurality of light transmitting areas.

* * * * *